US010181426B1

(12) United States Patent
Ching et al.

(10) Patent No.: US 10,181,426 B1
(45) Date of Patent: Jan. 15, 2019

(54) ETCH PROFILE CONTROL OF POLYSILICON STRUCTURES OF SEMICONDUCTOR DEVICES

(71) Applicant: Taiwan Semiconductor Manufacturing Co., Ltd., Hsinchu (TW)

(72) Inventors: Kuo-Cheng Ching, Hsinchu County (TW); Chih-Hao Wang, Hsinchu County (TW); Kuan-Ting Pan, Taipei (TW)

(73) Assignee: Taiwan Semiconductor Manufacturing Co., Ltd., Taiwan (CN)

( * ) Notice: Subject to any disclaimer, the term of this patent is extended or adjusted under 35 U.S.C. 154(b) by 0 days.

(21) Appl. No.: 15/800,959

(22) Filed: Nov. 1, 2017

Related U.S. Application Data

(60) Provisional application No. 62/552,241, filed on Aug. 30, 2017.

(51) Int. Cl.
| | |
|---|---|
| *H01L 21/8234* | (2006.01) |
| *H01L 27/088* | (2006.01) |
| *H01L 29/08* | (2006.01) |
| *H01L 29/78* | (2006.01) |
| *H01L 29/66* | (2006.01) |
| *H01L 29/423* | (2006.01) |

(52) U.S. Cl.
CPC ......... *H01L 21/823462* (2013.01); *H01L 21/823431* (2013.01); *H01L 27/0886* (2013.01); *H01L 29/0847* (2013.01); *H01L 29/42368* (2013.01); *H01L 29/66545* (2013.01); *H01L 29/7856* (2013.01)

(58) Field of Classification Search
CPC ............................................... H01L 21/823462
See application file for complete search history.

(56) References Cited

U.S. PATENT DOCUMENTS

| | | | |
|---|---|---|---|
| 6,674,134 B2 * | 1/2004 | Berry | H01L 21/76224 257/396 |
| 6,838,322 B2 * | 1/2005 | Pham | H01L 29/785 438/151 |

(Continued)

*Primary Examiner* — William Coleman
(74) *Attorney, Agent, or Firm* — Sterne, Kessler, Goldstein & Fox P.L.L.C.

(57) ABSTRACT

A method of forming first and second fin field effect transistors (finFETs) on a substrate includes forming first and second fin structures of the first and second finFETs, respectively, on the substrate and forming first and second oxide regions having first and second thicknesses on top surfaces of the first and second fin structures, respectively. The method further includes forming third and fourth oxide regions having third and fourth thicknesses on sidewalls on the first and second fin structures, respectively. The first and second thicknesses are greater than the third and fourth thicknesses, respectively. The method further includes forming a first polysilicon structure on the first and third oxide regions and forming a second polysilicon structure on the second and fourth oxide regions. The method also includes forming first and second source/drain regions on first and second recessed portions of the first and second fin structures, respectively and replacing the first and second polysilicon structures with first and second gate structures, respectively.

20 Claims, 19 Drawing Sheets

(56) References Cited

U.S. PATENT DOCUMENTS

| | | | |
|---|---|---|---|
| 2009/0101940 A1* | 4/2009 | Barrows | H03K 19/1778 257/204 |
| 2009/0108351 A1* | 4/2009 | Yang | H01L 27/108 257/347 |
| 2015/0102392 A1 | 4/2015 | Yu et al. | |
| 2016/0013106 A1 | 1/2016 | Fung | |
| 2016/0181360 A1 | 6/2016 | Wang | |
| 2016/0181428 A1 | 6/2016 | Chun et al. | |
| 2017/0053912 A1 | 2/2017 | Ching et al. | |

\* cited by examiner

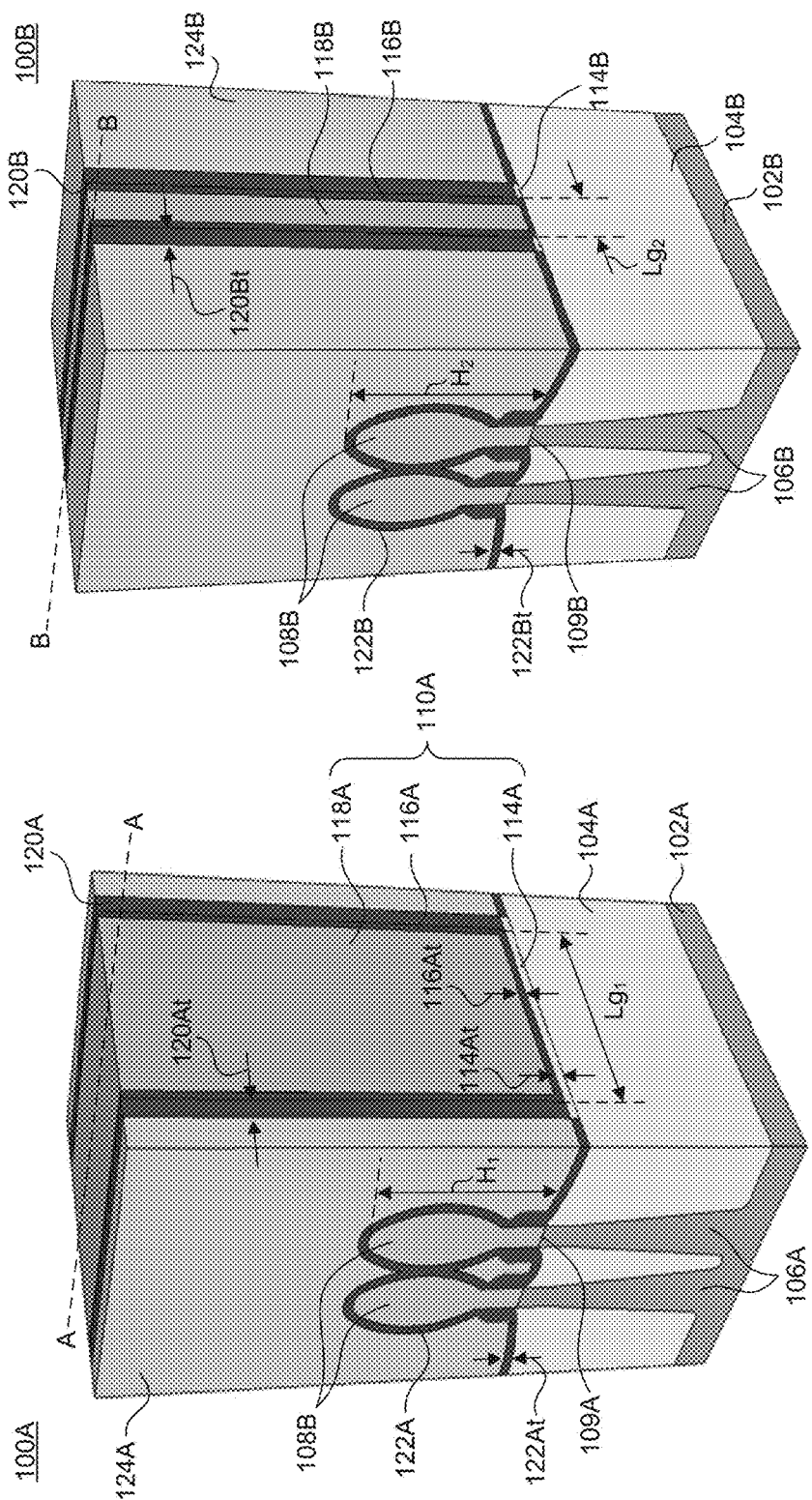

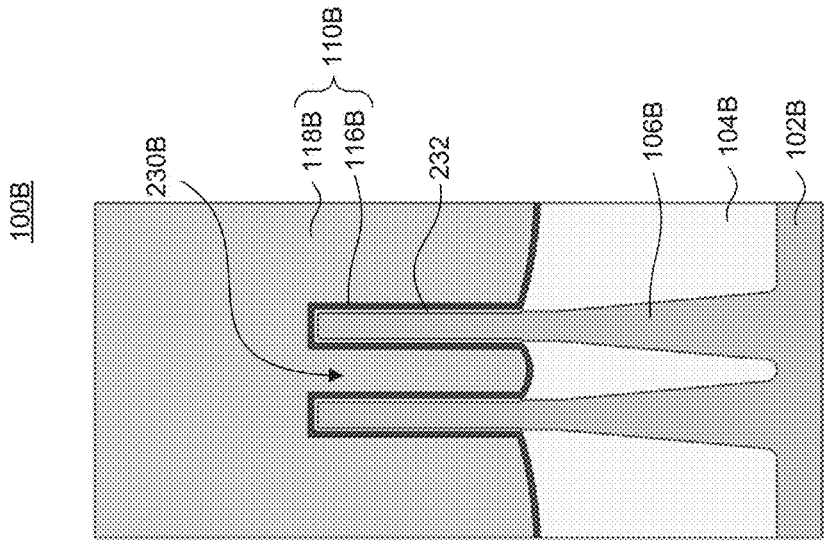
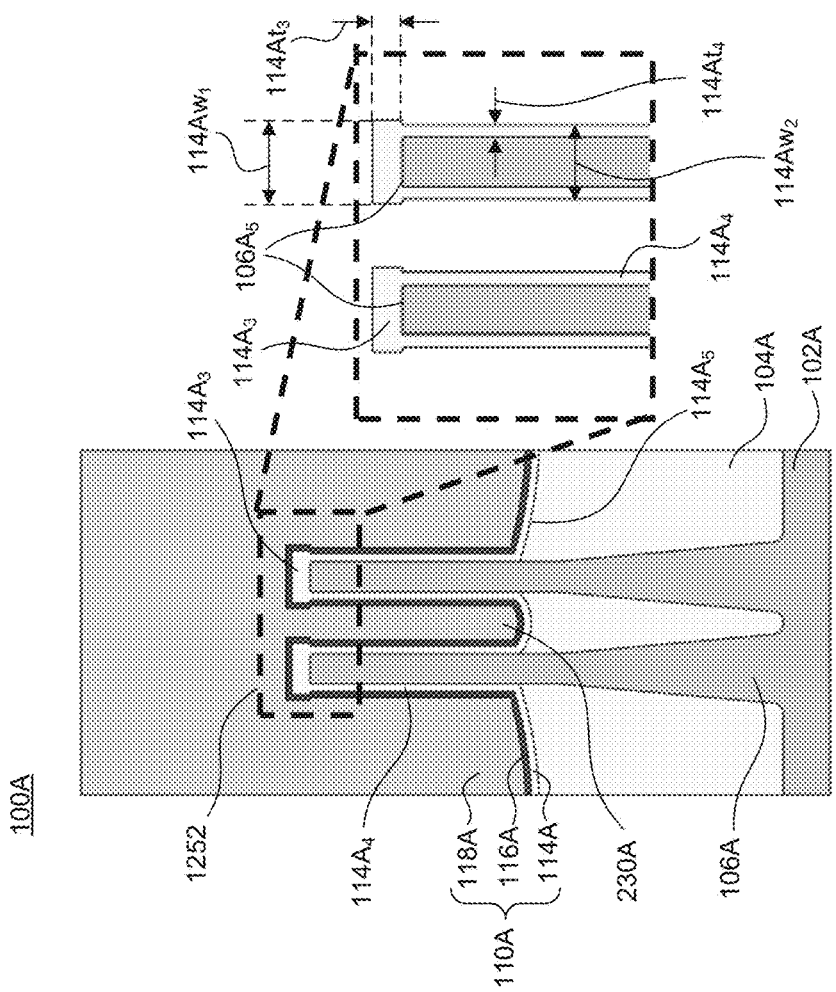
FIG. 12A
FIG. 12B

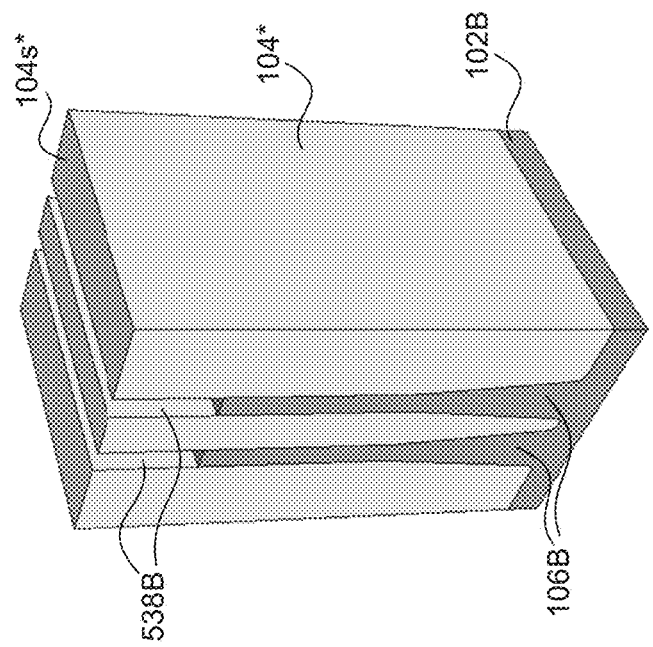
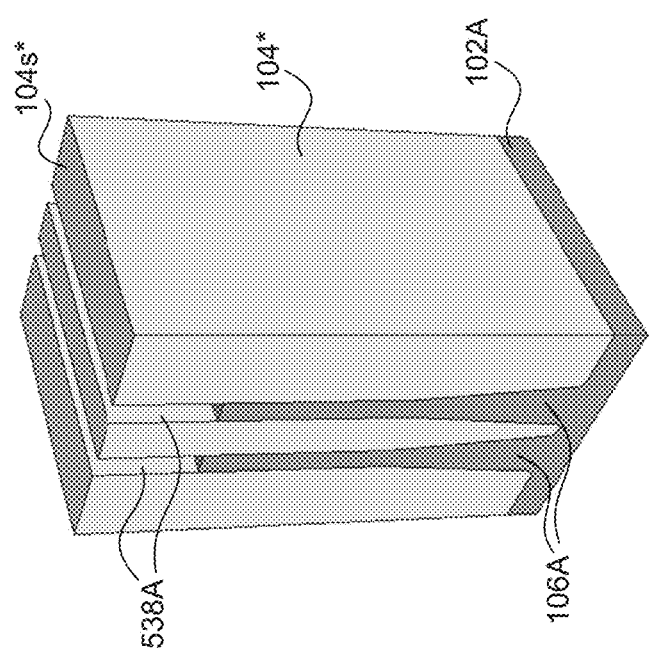

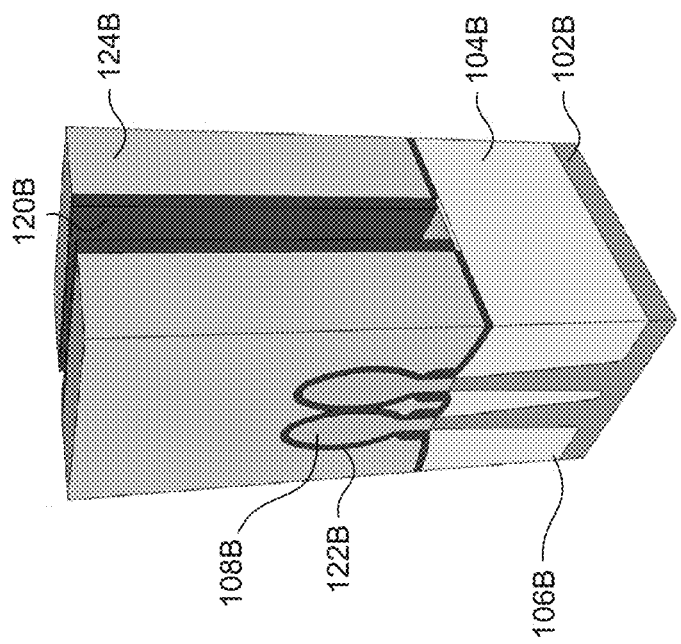
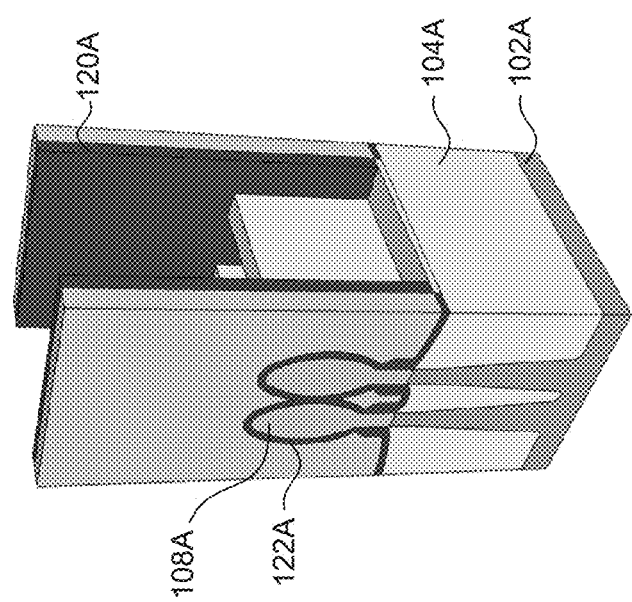
FIG. 18B
FIG. 18A

ETCH PROFILE CONTROL OF POLYSILICON STRUCTURES OF SEMICONDUCTOR DEVICES

This application claims the benefit of U.S. Provisional Patent Application No. 62/552,241, titled "Etch Profile Control of Polysilicon Structures of Semiconductor Devices," which was filed on Aug. 30, 2017 and is incorporated herein by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 1A-1B are isometric views of fin field effect transistors (finFETs), in accordance with some embodiments.

FIGS. 4A-11A and 4B-11B are isometric views of finFETs at various stages of their fabrication process, in accordance with some embodiments.

FIGS. 12A-12B are cross-sectional views of finFETs, in accordance with some embodiments.

FIGS. 14A-19A and 14B-19B are isometric views of finFETs at various stages of their fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figures 2A, 2B:
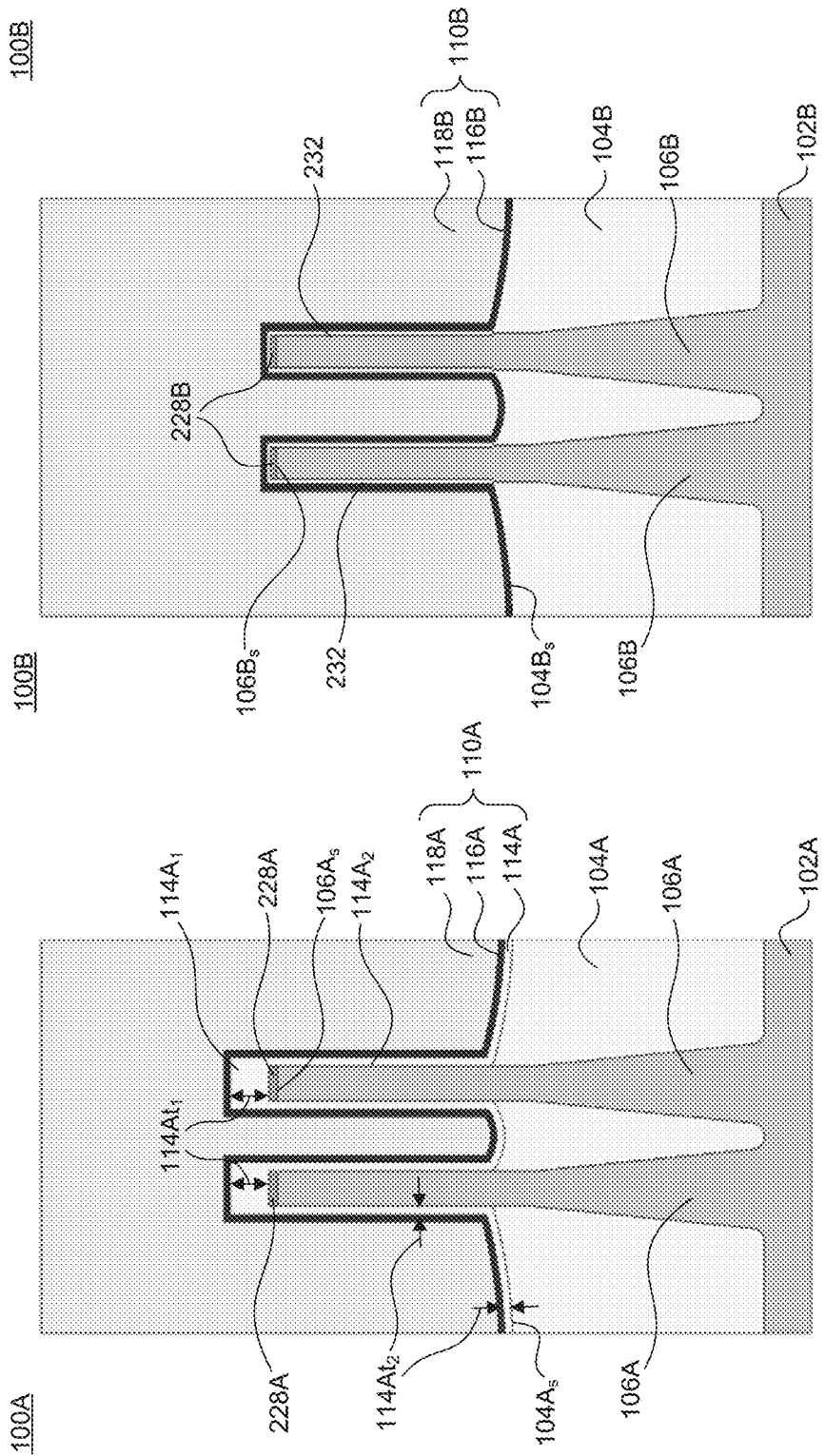
FIGS. 2A-2B are cross-sectional views of finFETs, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "selectivity" refers to the ratio of the etch rates of two materials under the same etching conditions.

As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "substantially" indicates the value of a given quantity varies by ±5% of the value.

As used herein, the term "substrate" describes a material onto which subsequent material layers are added. The substrate itself may be patterned. Materials added on top of the substrate may be patterned or may remain unpatterned. Furthermore, the substrate may be a wide array of semiconductor materials such as, for example, silicon, germanium, gallium arsenide, indium phosphide, etc. Alternatively, the substrate may be made from an electrically non-conductive material such as, for example, a glass or a sapphire wafer.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "low-k" refers to a small dielectric constant. In the field of semiconductor device structures and manufacturing processes, low-k refers to a dielectric constant that is less than the dielectric constant of $SiO_2$ (e.g., less than 3.9).

As used herein, the term "p-type" defines a structure, layer, and/or region as being doped with p-type dopants, such as, for example, boron.

As used herein, the term "n-type" defines a structure, layer, and/or region as being doped with n-type dopants, such as, for example, phosphorus.

As used herein, the term "vertical" means nominally perpendicular to the surface of a substrate.

As used herein, the term "critical dimension" refers to the smallest feature size (e.g., line width) of a finFET and/or an element of an integrated circuit.

This disclosure provides example methods for improving etch profiles of polysilicon structures of input/output (IO) devices (e.g., IO finFETs) and/or non-IO devices (e.g., non-IO finFETs) of integrated circuits. The polysilicon structures can be fabricated within high aspect ratio spaces (e.g., aspect ratio greater than 1:15, 1:18, or 1:20) between adjacent fin structures of the IO and/or non-IO devices. The example methods can form protective regions on the fin structures to obtain the improved etch profiles of the polysilicon structures without substantial damage to the fin structures. Improving the etch profiles of the polysilicon structures can help to improve subsequent formation of gate structures (e.g., replacement metal gate structures) of the IO and/or non-IO devices, and consequently, help to improve performance and reliability of the IO and/or non-IO devices.

The example methods can also help to substantially reduce or eliminate polysilicon residues in the high aspect ratio spaces between the adjacent fin structures of the IO and/or non-IO devices during the formation of the polysilicon structures. The substantial reduction or elimination of the polysilicon residue can help to substantially reduce or eliminate current leakage between subsequently formed source/drain (S/D) regions and gate structures of the IO and non-IO devices, and consequently, help to improve performance and reliability of the IO and/or non-IO devices.

The IO devices can be parts of peripheral circuits (e.g., IO circuits) formed in peripheral regions (also can be referred as "IO regions" or "high voltage regions") of the integrated circuit (IC). In contrast, the non-IO devices can be parts of core circuits (also can be referred as "logic circuits" or "memory circuits") formed in core regions (also can be referred as "logic regions" or "memory regions") of the IC. The IO devices can be configured to handle the input/output voltages/currents of the IC and to tolerate a greater amount of voltage or current swing than the non-IO devices. In some embodiments, the non-IO devices are referred as core devices, logic devices, and/or memory devices that are not configured to handle the input/output voltages/currents directly. In some embodiments, the non-IO devices include logic gates such as, for example, NAND, NOR, INVERTER, or a combination thereof. In some embodiments, the non-IO devices include a memory device such as, for example, a static random-access memory (SRAM) device.

FIGS. 1A and 1B are isometric views of an IO finFET 100A and a non-IO finFET 100B, respectively, according to some embodiments. The discussion below of elements in FIG. 1A applies to elements with the same annotations in FIG. 1B unless mentioned otherwise. It will be recognized that the views of finFETs 100A and 100B in respective FIGS. 1A and 1B are shown for illustration purposes and may not be drawn to scale.

In some embodiments, the above discussion of IO and non-IO devices applies to IO and non-IO finFETs 100A and 100B, respectively, unless mentioned otherwise. IO and non-IO finFETs 100A and 100B can be part of a same integrated circuit (IC) (not shown) and can be formed on respective substrates 102A and 102B that are be part of a same substrate, even though illustrated separately in respective FIGS. 1A and 1B for simplicity. In some embodiments, IO and non-IO finFETs 100A and 100B can include shallow trench isolation (STI) regions 104A and 104B, fin structures 106A and 106B, source/drain (S/D) regions 108A and 108B, gate structures 110A and 110B, spacers 120A and 120B, etch stop layers (ESLs) 122A and 122B, and interlayer dielectric (ILD) layers 124A and 124B, respectively. In some embodiments, IO and non-IO finFETs 100A and 100B can be either n-type finFETs or p-type finFETs. In some embodiments, IO and non-IO finFETs 100A and 100B can be n- and p-type finFETs, respectively, or p- and n-type finFETs, respectively.

Even though FIGS. 1A and 1B show IO and non-finFETs 100A and 100B each having respective two fin structures 106A and 106B, IO and non-finFETs 100A and 100B can each have one or more fin structures similar to respective fin structures 106A and 106B. In some embodiments, the spacing between fin structures 106A can be different from the spacing between fin structures 106B. In some embodiments, the IC can have one or more IO and non-IO finFETs similar to respective IO and non-finFETs 100A and 100B.

Substrates 102A and 102B can each be a physical material on which respective IO and non-finFETs 100A and 100B are formed. Substrates 102A and 102B can each be a semiconductor material such as, but not limited to, silicon. In some embodiments, each of substrates 102A and 102B includes a crystalline silicon substrate (e.g., wafer). In some embodiments, substrate 102 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrates 102A and 102B can each be doped depending on design requirements (e.g., p-type substrate or n-type substrate). In some embodiments, substrates 102A and 102B can each be doped with p-type dopants (e.g., boron, indium, aluminum, or gallium) or n-type dopants (e.g., phosphorus or arsenic). In some embodiments, substrates 102A and 102B can have opposite type dopants with respect to each other.

STI regions 104A and 104B provide electrical isolation to IO and non-finFETs 100A and 100B from each other and from neighboring active and passive elements (not illustrated herein) integrated with or deposited onto substrates 102A and 102B. STI regions 104A and 104B can each be made of a dielectric material. In some embodiments, STI regions 104A and 104B can each include silicon oxide, silicon nitride, silicon oxynitride, fluorine-doped silicate glass (FSG), a low-k dielectric material, and/or other suitable insulating material. In some embodiments, STI regions 104A and 104B can each include a multi-layered structure. In some embodiments, STI regions 104A and 104B can be formed substantially simultaneously during the fabrication of IO and non-IO finFETs 100A and 100B.

Fin structures 106A and 106B traverse along a Y-axis and through respective gate structures 110A and 110B. Portions of fin structures 106A and 106B extending above respective STI regions 104A and 104B can be wrapped around by respective gate structures 110A and 110B (not shown in FIGS. 1A and 1B; shown in FIGS. 2A and 2B). In some embodiments, fin structures 106A and 106B can each include material similar to substrates 102A and 102B. In some embodiments, fin structures 106A and 106B can each be formed from a photolithographic patterning and an etching of respective substrates 102A and 102B. Based on the disclosure herein, it will be recognized that other materials for fin structures 106A and 106B are within the scope and spirit of this disclosure. In some embodiments, fin structures 106A and 106B can be formed substantially simultaneously during the fabrication of IO and non-IO finFETs 100A and 100B.

Fin structures 106A and 106B and S/D regions 108A and 108B are current-carrying structures for respective IO and non-IO finFETs 100A and 100B. Channel regions (not shown) of IO and non-IO finFETs 100A and 100B can be formed in portions of their respective fin structures 106A and 106B underlying respective gate structures 110A and 110B. S/D regions 108A and 108B can each be epitaxially formed from top surface of respective fin structures 106A and 106B after an etch back process performed on portions of fin structures 106A and 106B that are not underlying respective gate structures 110 and 110A. In some embodiments, S/D regions 108A and 108B can be formed substantially simultaneously during the fabrication of IO and non-IO finFETs 100A and 100B. S/D regions 108A and 108B form respective interfaces 109A and 109B with fin structures 106A and 106B. In some embodiments, interfaces 109A and 109B are on the same plane as top surfaces of STI regions 104A and/or 104B. In some embodiments, interfaces 109A and 109B are below the top surface planes of STI regions 104A and/or 104B.

In some embodiments, S/D regions 108A and 108B can be unmerged as shown in FIGS. 1A and 1B, respectively. Alternatively to S/D regions 108A and 108B, IO and non-finFETs 100A and 100B can have merged epitaxial S/D region (not shown) on fin structures 106A and 106B. S/D regions 108A and 108B can each include an epitaxially-grown semiconductor material. In some embodiments, the epitaxially-grown semiconductor material is the same material as the material of substrates 102A and/or 102B. In some embodiments, the epitaxially-grown semiconductor material includes a different material from the material of substrates 102A and/or 102B. The epitaxially-grown semiconductor material can include: (i) a semiconductor material such as, for example, germanium or silicon; (ii) a compound semiconductor material such as, for example, gallium arsenide and/or aluminum gallium arsenide; or (iii) a semiconductor alloy such as, for example, silicon germanium and/or gallium arsenide phosphide. In some embodiments, S/D regions 108A and 108B can have respective heights $H_1$ and $H_2$ ranging from about 15 nm to about 25 nm. In some embodiments, heights $H_1$ and $H_2$ can be equal to or different from each other.

In some embodiments, S/D regions 108A and 108B can be grown by (i) chemical vapor deposition (CVD) such as, for example, by low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, S/D regions 108A and 108B can be grown by an epitaxial deposition/partial etch process, which repeats the epitaxial deposition/partial etch process at least once. Such repeated deposition/partial etch process is also called a "cyclic deposition-etch (CDE) process." In some embodiments, S/D regions 108A and 108B can be grown by selective epitaxial growth (SEG), where an etching gas is added to promote the selective growth of semiconductor material on the exposed surfaces of fin structures 106A and 106B, but not on insulating material (e.g., dielectric material of STI regions 104A and 104B).

In some embodiments, S/D regions 108A and 108B can be p-type or n-type. In some embodiments, S/D regions 108A and 108B can be of opposite doping type with respect to each other. In some embodiments, p-type S/D regions 108A and 108B can include SiGe and can be in-situ doped during an epitaxial growth process using p-type dopants such as, for example, boron, indium, or gallium. For p-type in-situ doping, p-type doping precursors such as, but not limited to, diborane ($B_2H_6$), boron trifluoride ($BF_3$), and/or other p-type doping precursors can be used.

In some embodiments, each of p-type S/D regions 108A and 108B can have a plurality of sub-regions (not shown) that include SiGe and can differ from each other based on, for example, doping concentration, epitaxial growth process conditions, and/or relative concentration of Ge with respect to Si. In some embodiments, each of the sub-regions can have thicknesses similar to or different from each other and thicknesses can range from about 0.5 nm to about 5 nm. In some embodiments, the atomic percent Ge in sub-regions closest to interfaces 109A and 109B can be smaller than the atomic percent Ge in sub-regions farthest from interfaces 109A and 109B. In some embodiments, the sub-regions closest to interfaces 109A and 109B can include Ge in a range from about 15 atomic percent to about 35 atomic percent, while the sub-regions farthest from interfaces 109A and 109B can include Ge in a range from about 25 atomic percent to about 50 atomic percent with any remaining atomic percent being Si in the sub-regions.

The plurality of sub-regions of p-type S/D regions 108A and 108B can be epitaxially grown under a pressure of about 10 Torr to about 300 Torr and at a temperature of about 500° C. to about 700° C. using reaction gases such as HCl as an etching agent, GeH4 as Ge precursor, dichlorosilane (DCS) and/or $SiH_4$ as Si precursor, $B_2H_6$ as B dopant precursor, $H_2$, and/or $N_2$. To achieve different concentration of Ge in the plurality of sub-regions, the ratio of a flow rate of Ge to Si precursors is varied during their respective growth process, according to some embodiments. For example, a Ge to Si precursor flow rate ratio in a range from about 9 to about 25 can be used during the epitaxial growth of the sub-regions closest to interfaces 109, while a Ge to Si precursor flow rate ratio less than about 6 can be used during the epitaxial growth of the sub-regions farthest from interfaces 109A and 109B.

The plurality of sub-regions of p-type S/D regions 108A and 108B can have varying p-type dopant concentration with respect to each other, according to some embodiments. For example, the sub-regions closest to interfaces 109A and 109B can be undoped or can have a dopant concentration lower (e.g., dopant concentration less than about $8\times10^{20}$ atoms/cm$^3$) than the dopant concentrations (e.g., dopant concentration in a range from about $1\times10^{20}$ to about $3\times10^{22}$ atoms/cm$^3$) of the sub-regions farthest from interfaces 109A and 109B.

In some embodiments, n-type S/D regions 108A and 108B can each include Si and can be in-situ doped during an epitaxial growth process using n-type dopants such as, for example, phosphorus or arsenic. For n-type in-situ doping, n-type doping precursors such as, but not limited to, phosphine (PH$_3$), arsine (AsH$_3$), and/or other n-type doping precursor can be used. In some embodiments, each of n-type S/D regions 108A and 108B can have a plurality of n-type sub-regions. Except for the type of dopants, the plurality of n-type sub-regions can be similar to the plurality of p-type sub-regions, in thickness, relative Ge concentration with respect to Si, dopant concentration, and/or epitaxial growth process conditions.

Based on the disclosure herein, it will be recognized that other materials, thicknesses, Ge concentrations, and dopant concentrations for the plurality of n-type and/or p-type sub-regions are within the scope and spirit of this disclosure.

Gate structure 110A of IO finFET 100A includes an IO oxide layer 114A, a dielectric layer 116A, and a gate electrode 118A. In some embodiments, IO oxide layer 114A can have a thickness 114At ranging from about 1 nm to about 3 nm and dielectric layer 116A can have a thickness 116A ranging from about 1 nm to about 5 nm. In some embodiments, IO oxide layer 114A and dielectric layer 116A combined can form the gate dielectric layer of IO finFET 100A. In some embodiments, IO oxide layer 114A can extend along a Y-axis in a manner such that a portion of IO oxide 114A can be under and in contact with dielectric layer 116A and another portion of IO oxide 114 can be under and in contact with spacers 120A as shown in FIG. 1A.

In contrast to gate structure 110A, gate structure 110B of non-IO finFET 100B can include dielectric layer 116B and gate electrode 118B and can exclude any IO oxide layer. In some embodiments, dielectric layer 116B can have a thickness 116A ranging from about 1 nm to about 5 nm. In some embodiments, dielectric layer 116A without any additional IO oxide layer like IO oxide layer 114A can form the gate dielectric layer of non-IO finFET 100B. As such, in some embodiments, the gate dielectric layer of IO finFET 100A can be thicker than the gate dielectric layer of non-IO finFET 100B. The thicker gate dielectric layer of IO finFET 100A can help to handle higher voltage/current applied to the peripheral and/or IO circuit of the IC having IO and non-IO finFETs 100A and 100B compared to the core circuit of the IC.

In some embodiments, non-IO finFET 100B does not include oxide layers 114B under gate structure 110B, but can include oxide layers 114B under spacers 120B as shown in FIG. 1B. In some embodiments, oxide layer 114B can have a vertical thickness ranging from about 1 nm to about 3.

In some embodiments, dielectric layers 116A and 116B and gate electrodes 118A and 118B can be formed substantially simultaneously by a gate replacement process during the fabrication of IO and non-IO finFETs 100A and 100B. Gate structures 110A and 110B can have respective horizontal dimensions along a Y-axis (e.g., gate lengths) $Lg_1$ and $Lg_2$ that range from about 5 nm to about 50 nm, according to some embodiments. In some embodiments, gate electrodes 118A and 118B can have horizontal dimensions (e.g., along gate lengths) that are equal to or different from each other.

In some embodiments, dielectric layers 116A and 116B can each include silicon oxide and formed by CVD, atomic layer deposition (ALD), physical vapor deposition (PVD), e-beam evaporation, or other suitable process. In some embodiments, dielectric layers 116A and 116B can each include (i) a layer of silicon oxide, silicon nitride, and/or silicon oxynitride, (ii) a high-k dielectric material such as, for example, hafnium oxide (HfO$_2$), titanium oxide (TiO$_2$), hafnium zirconium oxide (HfZrO), tantalum oxide (Ta$_2$O$_3$), hafnium silicate (HfSiO$_4$), zirconium oxide (ZrO$_2$), zirconium silicate (ZrSiO$_2$), (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof. High-k dielectric layers can be formed by ALD and/or other suitable methods. In some embodiments, dielectric layers 116A and 116B can each include a single layer or a stack of insulating material layers. Based on the disclosure herein, it will be recognized that other materials and formation methods for dielectric layers 116A and 116B are within the scope and spirit of this disclosure.

In some embodiments, IO oxide layer 114A and oxide layer 114B can each include silicon oxide and formed by CVD, atomic layer deposition (ALD), physical vapor deposition (PVD), e-beam evaporation, or other suitable process. Based on the disclosure herein, it will be recognized that other oxide materials and formation methods for IO oxide layer 114A and oxide layer 114B are within the scope and spirit of this disclosure. In some embodiments, oxide layers 114A and 114B can be deposited substantially simultaneously during the fabrication of IO and non-IO finFETs 100A and 100B.

Gate electrodes 118A and 118B can each include a gate work function metal layer (not shown) and a gate metal fill layer (not shown). In some embodiments, gate work function metal layers and gate metal fill layers of gate electrodes 118A and 118B can be formed substantially simultaneously by a gate replacement process during the fabrication of IO and non-IO finFETs 100A and 100B. In some embodiments, gate work function metal layers are disposed on dielectric layers 116A and 116B. The gate work function metal layers can each include a single metal layer or a stack of metal layers. The stack of metal layers can include metals having work functions similar to or different from each other. In some embodiments, the gate work function metal layer can include, for example, aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. The gate work function metal layer can be formed using a suitable process such as ALD, CVD, PVD, plating, or combinations thereof. In some embodiments, the gate work function metal layer has a thickness in a range from about 2 nm to about 15 nm. Based on the disclosure herein, it will be recognized that other materials, formation methods, and thicknesses for the gate work function metal layer are within the scope and spirit of this disclosure.

The gate metal fill layers can each include a single metal layer or a stack of metal layers. The stack of metal layers can include metals different from each other. In some embodiments, the gate metal fill layers can each include a suitable conductive material such as, for example, Ti, silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and/or combinations thereof. The gate metal fill layers can be formed by ALD, PVD, CVD, or other suitable deposition process. Based on the disclosure herein, it will be recognized that other materials and formation methods for the gate metal fill layer are within the scope and spirit of this disclosure.

Spacers 120A and 120B form sidewalls of respective gate structures 110A and 110B and are in contact with respective dielectric layers 116A and 116B. Spacers 120A and 120B can each include insulating material such as, for example, silicon oxide, silicon nitride, a low-k material, or a combination thereof. Spacers 120A and 120B can each have a low-k material with a dielectric constant less than 3.9 (e.g., less than 3.5, 3, or 2.8). In some embodiments, each of spacers 120A and 120B can have respective thicknesses 102At and 120Bt in a range from about 7 nm to about 10 nm. Based on the disclosure herein, it will be recognized that other materials and thicknesses for spacers 120A and 120B are within the scope and spirit of this disclosure.

Etch stop layers (ESLs) 122A and 122B can be configured to protect respective S/D regions 108A and 108B during subsequent processing of IO and non-IO finFETs 100A and 100B. This protection can be provided, for example, during formation of ILD layers 124A and 124B and/or contact structures (not shown). ESLs 122A and 122B can be disposed on sidewalls of respective spacers 122A and 122B. In some embodiments, ESLs 122A and 122B can each include, for example, silicon nitride ($SiN_x$), silicon oxide ($SiO_x$), silicon oxynitride (SiON), silicon carbide (SiC), silicon carbo-nitride (SiCN), boron nitride (BN), silicon boron nitride (SiBN), silicon carbon boron nitride (SiCBN), or a combination thereof. In some embodiments, ESLs 122A and 122B can each include silicon nitride or silicon oxide formed by low pressure chemical vapor deposition (LPCVD), plasma enhanced chemical vapor deposition (PECVD), chemical vapor deposition (CVD), or silicon oxide formed by a high-aspect-ratio process (HARP). In some embodiments, ESLs 122A and 122B can each have a thickness 122At and 122Bt, respectively, in a range from about 3 nm to 10 nm or from about 10 nm to about 30 nm. Based on the disclosure herein, it will be recognized that other materials, formation methods, and thicknesses for ESLs 122A and 122B are within the scope and spirit of this disclosure.

ILD layers 124A and 124B can be disposed on ESLs 122A and 122B, respectively, and each of ILD layers 124A and 124B can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using flowable CVD (FCVD). In some embodiments, the dielectric material is silicon oxide. In some embodiments, ILD layers 124A and 124B can have a vertical thickness along a Z-axis in a range from about 50 nm to about 200 nm. Based on the disclosure herein, it will be recognized that other materials, thicknesses, and formation methods for ILD layers 124A and 124B are within the scope and spirit of this disclosure.

FIGS. 1A-1B show one gate structure 110A and 110B for IO and non-IO finFETs, respectively. However, based on the disclosure herein, it will be recognized that IO and non-IO finFETs 100A and/or 100B can have additional gate structures similar and parallel to respective gate structures 110A and 110B. In addition, IO and non-IO finFETs 100A and/or 100B can be incorporated into an integrated circuit through the use of other structural components such as gate contact structures, S/D contact structures, conductive vias, conductive lines, dielectric layers, passivation layers, etc., that are omitted for the sake of clarity. Based on the disclosure herein, it will be recognized that cross-sectional shapes of STI regions 104A and 104B, fin structures 106A and 106B, S/D regions 108A and 108B, gate structures 110A and 110B, and spacers 120A and 120B are illustrative and are not intended to be limiting.

FIGS. 2A and 2B are cross-sectional views along lines A-A and B-B of IO and non-IO finFETs 100A and 100B of FIGS. 1A and 1B, respectively, according to some embodiments. Elements in FIGS. 2A and 2B with the same annotations as elements in FIGS. 1A and 1B are described above. It will be recognized that the views of IO and non-IO finFETs 100A and 100B in FIGS. 2A and 2B are shown for illustration purposes and may not be drawn to scale. Based on the disclosure herein, it will be recognized that cross-sectional shapes of STI regions 104A and 104B, fin structures 106A and 106B, and gate structures 110A and 110B shown in FIGS. 2A and 2B are illustrative and are not intended to be limiting.

As shown in FIG. 2A, IO oxide layer 114A, dielectric layer 116A, and gate electrode 118A of IO finFET 100A wrap around portions of fin structures 106A extending above STI region 104A. In some embodiments, IO oxide layer 114A have a first portion $114A_1$ having a first thickness $114At_1$ on top surfaces 106As of portions of fin structures 106A extending above STI region 104A and have a second portion $114A_2$ having a second thickness $114At_2$ on top surface 104As of STI region 104A and on sidewalls of portions of fin structures 106A extending above STI region 104A. In some embodiments, thickness $114At_1$ can be greater than thickness $114At_2$ by a value ranging from about 0.5 nm to about 3 nm. Thickness $114At_1$ can range from about 2 nm to about 5 nm and thickness $114At_2$ can range from about 1 nm to about 3 nm, according to some embodiments.

The thicker portions $114A_1$ of IO oxide layer 114A on top surfaces 106As can help to protect fin structures 106A during patterning and etching of polysilicon structure (element 842A shown in FIG. 8A) that can be subsequently replaced by gate structure 110A in a gate replacement process. The presence of these protective thicker portions $114A_1$ of IO oxide layer 114A can allow longer etching time than used in other finFETs for removing polysilicon from high aspect ratio spaces 230A (e.g., aspect ratio greater than 1:15, 1:18, or 1:20) between fin structures 106A without substantially etching and/or damaging fin structures 106A during the formation of the polysilicon structures (element 842A shown in FIG. 8A). The longer etching time can help to substantially reduce or eliminate polysilicon residue in spaces 230A, and consequently, improve performance and reliability of IO finFET 100A. Thus, IO oxide layer 114A can act as a protective oxide layer and also form a part of gate dielectric layer of IO finFET 100A.

In some embodiments, the thicker portions $114A_1$ of IO oxide layer 114A can be formed on top surfaces 106As of fin structures 106A. Such thicker portions 114A$_1$ on top surfaces 106As can be performed by forming doped amorphous Si (a-Si) (shown in FIG. 6A) on top surfaces 106As followed by deposition of an oxide layer on the doped a-Si layer and a high temperature anneal treatment of the doped a-Si and deposited oxide layer. The doped a-Si can be oxidized during the deposition of the oxide layer and during the high temperature anneal treatment. The oxidized doped a-Si and portions of the deposited oxide layer on top surfaces 106As combined can form the thicker portions 114A$_1$ of IO oxide layer 114A having first thickness 114At$_1$. The process of forming thicker IO oxide layer 114A on top surfaces 106As is described in further details with reference to FIGS. 5A-7A and 5B-7B.

In some embodiments, as shown in FIG. 2A, portions 228A of the doped a-Si can remain unoxidized and form an interlayer between top surfaces 106As and IO oxide layer 114A. Portions 228A can have a vertical thickness ranging from about 0.01 nm to about 5 nm. In some embodiments, portions 228A can be absent in IO finFET 100A when there is no unoxidized doped a-Si.

In some embodiments, portions of fin structures 106A extending above STI region 104A can each have a vertical height ranging from about 40 nm to about 60 nm, can each have a width ranging from about 5 nm to about 10 nm, and can have a fin-to-fin pitch ranging from about 20 nm to about 30 nm.

Referring to FIG. 2B, similar to IO finFET 100A, dielectric layer 116B and gate electrode 118B of non-IO finFET 100B wrap around portions of fin structures 106B extending above STI region 104B. Also, shown in FIG. 2B, in contrast to IO finFET 100A, non-IO finFET 100B may not have an IO oxide layer similar to IO oxide layer 114A on top surface 104Bs of STI region 104B and between dielectric layer 116B and portions of fin structures 106B extending above STI region 104B. However, as discussed below with reference to FIGS. 5B-11B, a protective oxide layer (not shown in FIG. 2B; element 114B shown in FIGS. 1B and 7B) similar to IO oxide layer 114A (discussed above with reference to FIG. 2A) can be used to protect fin structures 106B during the formation of polysilicon structures (element 842B shown in FIG. 8B) of non-IO finFET 100B. The protective oxide layer 114B can be removed prior to the formation of gate structure 110B. Similar to IO oxide layer 114A, the protective oxide layer can allow longer etching time for removing polysilicon from high aspect ratio spaces 230B (e.g., aspect ratio greater than 1:15, 1:18, or 1:20) between fin structures 106B without substantially etching and/or damaging fin structures 106B during the formation of the polysilicon structures (element 842B shown in FIG. 8B). The longer etching time can help to substantially reduce or eliminate polysilicon residue in spaces 230B, and consequently, improve performance and reliability of non-IO finFET 100B.

Further in contrast to IO finFET 100A, non-IO finFET 100B can have an oxide layer 232 wrapped around portions of fin structures 106B extending above STI region 104B and not on top surface 104Bs of STI region 104B, according to some embodiments. In some embodiments, portions of oxide layer 232 on top surface 106Bs or on portions 228B and portions of oxide layer 232 on sidewalls of fin structures 106B can substantially have equal thickness with respect to each other. Oxide layer 232 can be formed during a wet clean process after the removal of the protective oxide layer of non-IO finFET 100B. In some embodiments, oxide layer 232 can have a thickness ranging from about 0.5 nm to about 2 nm.

In some embodiments, similar to portions 228A of IO finFET 100A, non-IO finFET 100B can have unoxidized portions 228B of doped a-Si forming an interlayer between top surfaces 106Bs and oxide layer 232. Portions 228B can have a vertical thickness ranging from about 0.01 nm to about 5 nm. In some embodiments, portions 228B can be absent in non-IO finFET 100B when there is no unoxidized doped a-Si.

In some embodiments, portions of fin structures 106B extending above STI region 104B can each have a vertical height ranging from about 40 nm to about 60 nm, can each have a width ranging from about 5 nm to about 10 nm, and can have a fin-to-fin pitch ranging from about 20 nm to about 30 nm. In some embodiments, fin structures 106A and 106B can have heights, widths, and fin-to-fin pitch equal to or different from each other.

Figure 3:
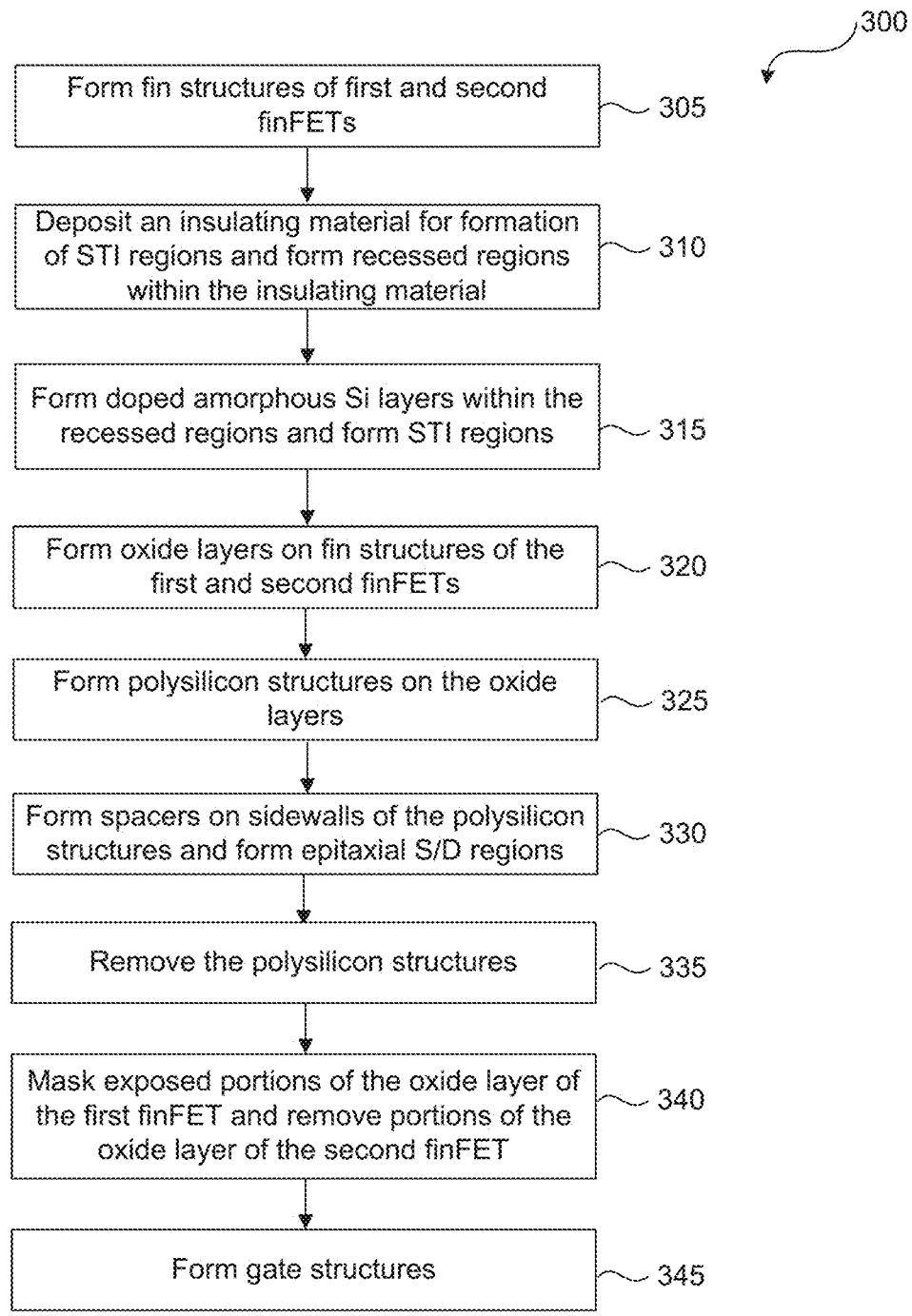
FIG. 3 is a flow diagram of a method for fabricating finFETs, in accordance with some embodiments.

FIG. 3 is a flow diagram of an example method 300 for fabricating IO and non-IO finFETs 100A and 100B as described with reference to FIGS. 1A-2A and 1B-2B, according to some embodiments. For illustrative purposes, the operations illustrated in FIG. 3 will be described with reference to the example fabrication process for fabricating devices 100A and 100B as illustrated in FIGS. 4A-11A and FIGS. 4B-11B, respectively. FIGS. 4A-11A and 4A-11B are isometric views of respective IO and non-IO finFETs 100A and 100B at various stages of its fabrication, according to some embodiments. Operations can be performed in a different order or not performed depending on specific applications. It should be noted that method 300 does not produce complete IO and non-IO finFETs 100A and 100B. Accordingly, it is understood that additional processes may be provided before, during, and after method 300, and that some other processes may only be briefly described herein. Elements in FIGS. 4A-11A and 4B-11B with the same annotations as elements in FIGS. 1A-1B and 2A-2B are described above.

Figure 4A:
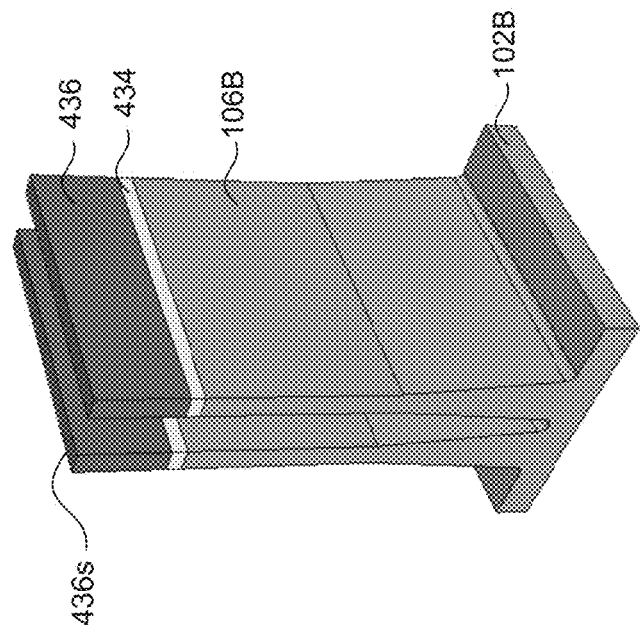
Figure 4B:
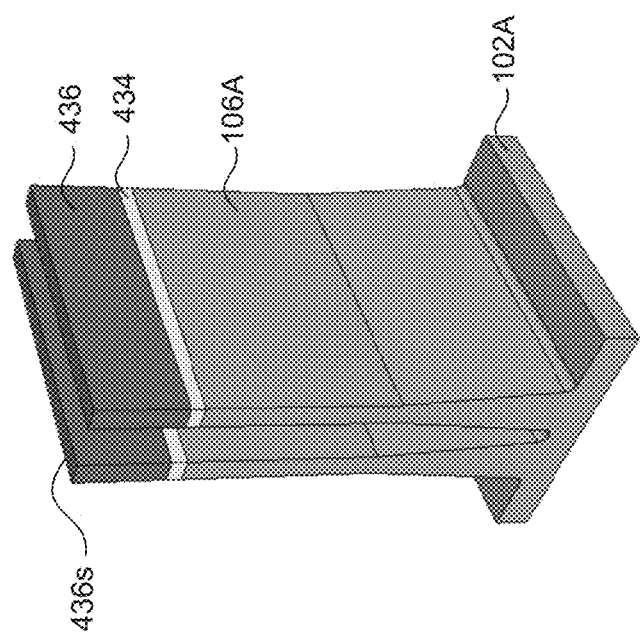
Figure 5B:
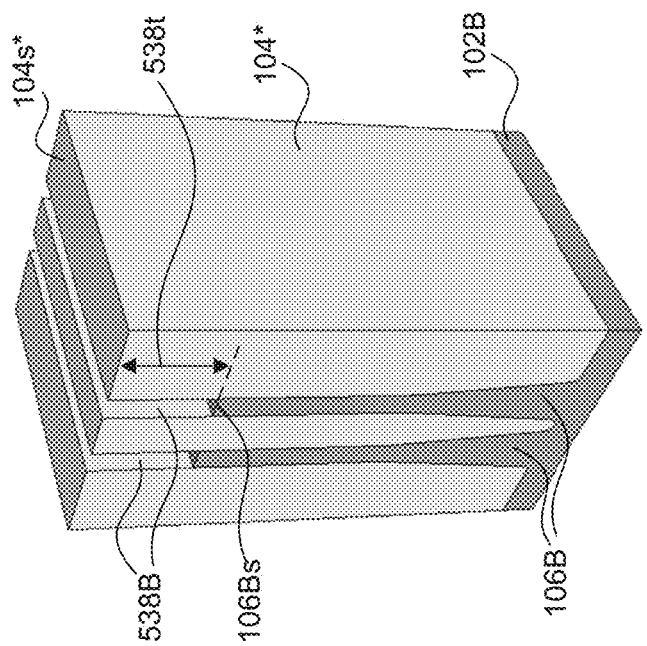
Figure 5A:
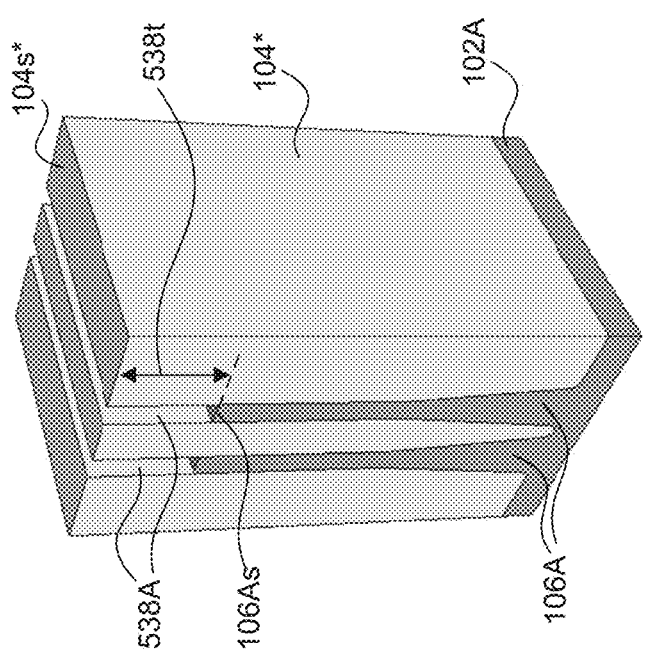

In operation 305, fin structures of first and second finFETs are formed on a substrate. For example, as shown in FIGS. 4A and 4B, fin structures 106A of IO finFET 100A and fin structures 106B of non-IO finFET 100B are formed substantially simultaneously on respective substrates 102A and 102B. Substrates 102A and 102B can be different parts of the same substrate. Fin structures 106A and 106B can be formed by simultaneously etching respective substrates 102A and 102B through patterned hard mask layers 434 and 436 formed on unetched substrates 102A and 102B. In some embodiments, hard mask layer 434 is a thin film including silicon oxide formed, for example, using a thermal oxidation process. In some embodiments, hard mask layer 436 can be formed of silicon nitride using, for example, low pressure chemical vapor deposition (LPCVD) or plasma enhanced CVD (PECVD).

In referring to FIG. 3, in operation 310, a layer of insulating material for STI regions is deposited and the patterned hard mask layers are removed to form recessed regions within the layer of insulating material. For example, a layer of insulating material 104* can be blanket deposited on the structures of FIGS. 4A and 4B followed by a chemical mechanical polishing (CMP) process, and an etching process to form the structures of FIGS. 5A and 5B substantially simultaneously. The CMP process can substantially coplanarize (not shown) top surface 104s* of layer of insulating material 104* with top surface 436s of hard mask layer 436. The CMP process can be followed by an etching process (e.g., reaction ion etching using a chlorine based etchant) to remove hard mask layers 434 and 436 and form recessed regions 538A and 538B within layer of insulating material 104*. In some embodiments, recessed regions 538A and 538B can each have a height 538t ranging from about 5 nm to about 20 nm.

In some embodiments, layer of insulating material 104* can include, for example, silicon oxide, silicon nitride, silicon oxynitride, fluoride-doped silicate glass (FSG), or a low-k dielectric material. In some embodiments, layer of insulating material 104* can be deposited using a flowable chemical vapor deposition (FCVD) process, a high-density-plasma (HDP) CVD process, using silane ($SiH_4$) and oxygen ($O_2$) as reacting precursors. In some embodiments, layer of insulating material 104* can be formed using a sub-atmospheric CVD (SACVD) process or high aspect-ratio process (HARP), where process gases can include tetraethoxysilane (TEOS) and/or ozone ($O_3$). In some embodiments, layer of insulating material 104* can be formed using a spin-on-dielectric (SOD) such as, for example, hydrogen silsesquioxane (HSQ) or methyl silsesquioxane (MSQ).

In referring to FIG. 3, in operation 315, doped amorphous Si (a-Si) layers are formed within the recessed regions and STI regions are formed. For example, a layer of a-Si can be blanket deposited on the structures of FIGS. 5A and 5B followed by a chemical mechanical polishing (CMP) process, a doping process, and an etching process to form the structures of FIGS. 6A and 6B substantially simultaneously. The layer of a-Si can be blanket deposited using, for example, a CVD, PVD, or ALD process. The CMP process can substantially coplanarize (not shown) top surface of layer of a-Si with top surface 104s* of layer of insulating material 104* such that recessed regions 538A and 538B are filled with layers of a-Si (not shown). In some embodiments, instead of the blanket deposition of the layer of a-Si, layers of a-Si can be epitaxially grown on top surfaces 106As and 106Bs to fill respective recessed regions 538A and 538B followed by a CMP process to substantially coplanarize top surfaces of the epitaxial layers of a-Si with top surface 104s* of layer of insulating material 104*.

The CMP process can be followed by a doping process (e.g., ion implantation) to introduce dopants such as, for example, fluorine or oxygen into the layers of a-Si within recessed regions 538A and 538B to form doped a-Si layers 640A and 640B. The concentration of dopants in a-Si layers 640A and 640B can range from about $1\times10^{15}$ to about $1\times10^{23}$ atoms/cm$^3$. In some embodiments, the dopants can be ion implanted into the layers of a-Si at room temperature and at an energy ranging from about 2 keV to about 10 keV. In some embodiments, the CMP process can be performed after the doping process instead of performing prior to the doping process. In some embodiments, doped a-Si layers 640A and 640B can have respective thicknesses 640At and 640Bt ranging from about 5 nm to about 20 nm.

Figure 6B:
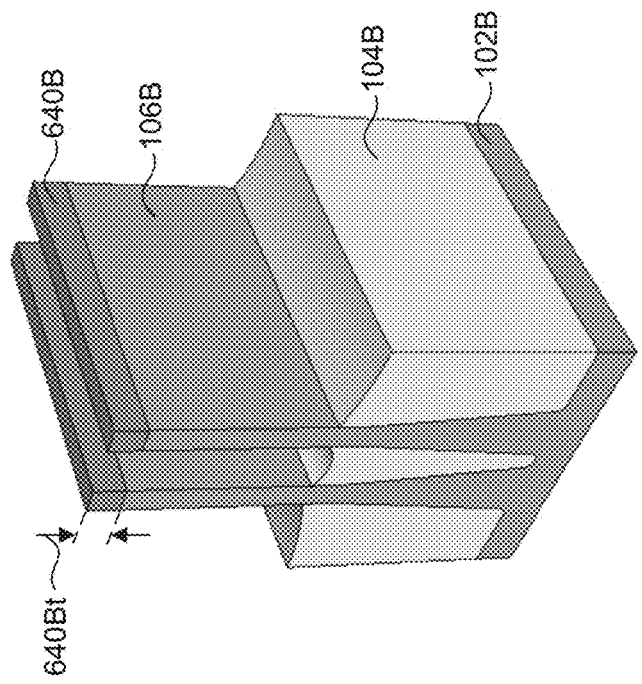
Figure 6A:
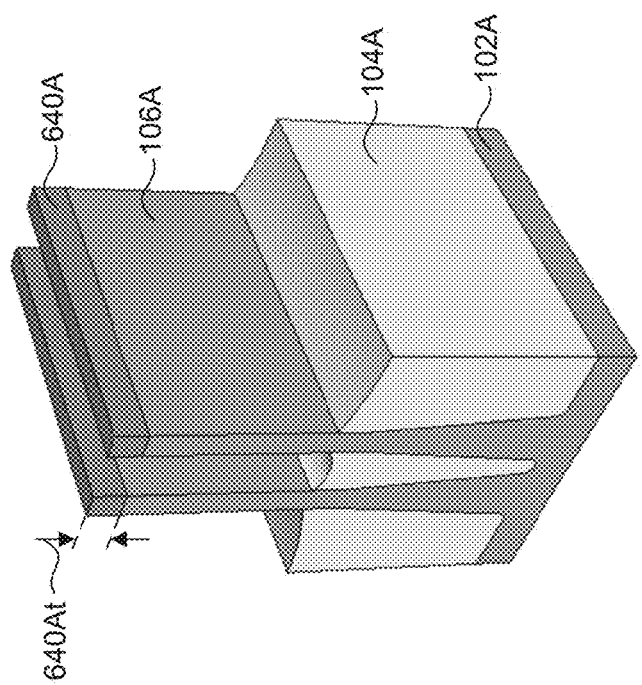

The formation of doped a-Si layers 640A and 640B can be followed by an etching process to etch back layer of insulating material 104* and form STI regions 104A and 104B substantially simultaneously as shown in FIGS. 6A and 6B. The etch back of layer of insulating material 104* can be performed, for example, by a dry etch process, a wet etch process, or a combination thereof. In some embodiments, the dry etch process can include using a plasma dry etch with a gas mixture having octafluorocyclobutane ($C_4F_8$), argon (Ar), oxygen ($O_2$), and helium (He), fluoroform ($CHF_3$) and He, carbon tetrafluoride ($CF_4$), difluoromethane ($CH_2F_2$), chlorine ($Cl_2$), and $O_2$, hydrogen bromide (HBr), $O_2$, and He, or a combination thereof with a pressure ranging from about 1 mTorr to about 5 mTorr. In some embodiments, the wet etch process can include using a diluted hydrofluoric acid (DHF) treatment, an ammonium peroxide mixture (APM), a sulfuric peroxide mixture (SPM), hot deionized water (DI water), or a combination thereof. In some embodiments, the wet etch process can include using an etch process that uses ammonia ($NH_3$) and hydrofluoric acid (HF) as etchants and inert gases such as, for example, Ar, xenon (Xe), He, or a combination thereof. In some embodiments, the flow rate of HF and $NH_3$ used in the etch process can each range from about 10 sccm to about 100 sccm (e.g., about 20 sccm, 30 sccm, or 40 sccm). In some embodiments, the etch process can be performed at a pressure ranging from about 5 mTorr to about 100 mTorr (e.g., about 20 mTorr, about 30 mTorr, or about 40 mTorr) and a high temperature ranging from about 50° C. to about 120° C.

In referring to FIG. 3, in operation 320, an IO oxide layer and a protective oxide layer are formed on respective fin structures of the first and second finFETs. For example, a layer of oxide material can be blanket deposited on the structures of FIGS. 6A and 6B followed by a high temperature anneal process to form IO oxide layer 114A and protective oxide layer 114B substantially simultaneously as shown in respective FIGS. 7A and 7B. Oxide layers 114A and 114B can be portions of a same continuous oxide layer. The layer of oxide material can include, for example, silicon oxide and can be formed by CVD, atomic layer deposition (ALD), plasma enhanced ALD (PEALD), physical vapor deposition (PVD), e-beam evaporation, or other suitable process. In some embodiments, the layer of oxide material can be deposited using PEALD at an energy ranging from about 400 W to about 500 W and at a temperature ranging from about 300° C. to about 500° C.

The deposition of the layer of oxide material can be followed by a high temperature anneal process. In some embodiments, the structures of FIGS. 6A and 6B after the deposition of the layer of oxide material can be subjected to a dry anneal process under oxygen gas flow at a temperature ranging from about 800° C. to about 1050° C. The oxygen precursor concentration can be in a range of about 0.5% to about 5% of the total gas flow rate. This high temperature anneal process can convert portions doped a-Si layers 640A and 640B into oxide layers that form portions of respective oxide layers 114A and 114B over respective top surfaces 106As and 106Bs as shown in respective FIGS. 7A and 7B. In some embodiments, doped a-Si layers 640A and 640B can be converted into oxide layers. The conversion process can start from the top of doped a-Si layers 640A and 640B due to a greater presence of oxygen precursors at the top surfaces. In some embodiments, factors—such as a higher annealing temperature, a greater fluorine dopant concentration in the a-Si layer, and a higher oxygen gas flow rate—can lead to a faster conversion rate of doped a-Si layers; in turn, the faster conversion rate can lead to a greater thickness of formed silicon oxide material. In some embodiments, the conversion process can be a timed process where a nominal thickness of the converted silicon oxide material can be achieved by controlling the anneal time. In some embodiments, the anneal process can be a flash process where the anneal time can be between about 0.5 s to 5 s, such as 1 s. As a result of the anneal process, portions $114A_1$ and $114B_1$ of respective oxide layers 114A and 114B on respective top surfaces 106As and 106Bs can be thicker than portions $114A_2$ and $114B_2$ of respective oxide layers 114A and 114B on sidewalls of respective fin structures 106A and 10B.

Portions $114A_1$ and $114B_1$ of respective oxide layers 114A and 114B on respective top surfaces 106As and 106Bs have a greater thickness due to the presence of dopants in doped a-Si layers 640A and 640B that can facilitate the oxidation rate during the deposition of the layer of oxide material on the structures of FIGS. 6A and 6B. For example, during the anneal process of fluorine-doped a-Si layers 640A and 640B, fluorine-silicon chemical bonds can be broken and the fluorine atoms can increase an oxidation rate of the silicon atoms. As doped a-Si layers 640A and 640B are not deposited on sidewalls of respective fin structures 106A and 106B, portions $114A_2$ and $114B_2$ on the sidewalls are thinner than portions $114A_1$ and $114B_1$ on respective top surfaces 106As and 106Bs. As such, with the use of doped a-Si layers 640A and 640B, thicker oxide layers can be formed on top surfaces 106As and 106Bs of fin structures 106A and 106B. These thicker portions $114A_1$ and $114B_1$ on respective top surfaces 106As and 106Bs can help to protect respective fin structures 106A and 106B during patterning and etching of respective polysilicon structures (elements 842A and 842B shown in FIGS. 8A and 8B) that can be subsequently replaced by respective gate structures 110A and 110B in a gate replacement process.

In some embodiments, portions $114A_1$ of IO oxide layer 114A on top surfaces 106As can have a first thickness $114At_1$ ranging from about 2 nm to about 5 nm. In some embodiments, portions $114A_2$ of IO oxide layer 114A on sidewalls of fin structures 106A and on STI region 104A can have a second thickness $114At_2$ ranging from about 1 nm to about 3 nm. In some embodiments, thickness $114At_1$ can be greater than thickness $114At_2$ by a value ranging from about 0.5 nm to about 3 nm. Thicknesses $114Bt_1$ and $114Bt_2$ of protective oxide layer 114B can be substantially equal to respective thicknesses $114At_1$ and $114At_2$.

Figure 7B:
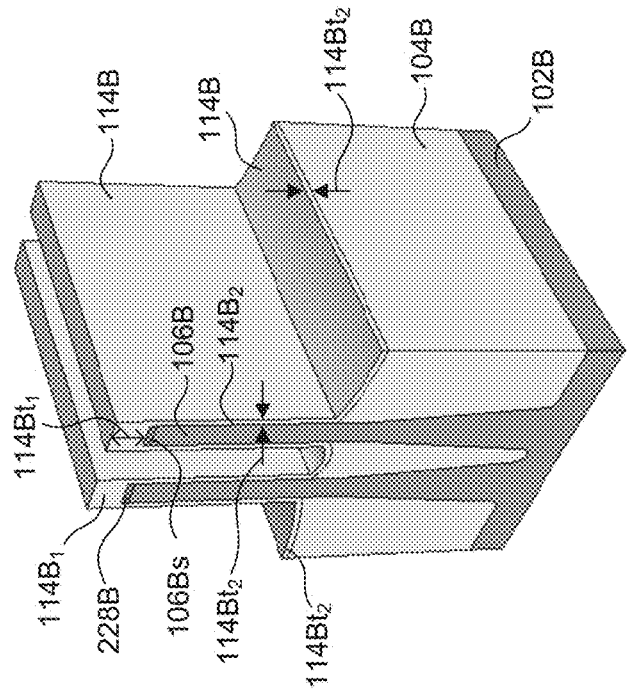
Figure 7A:
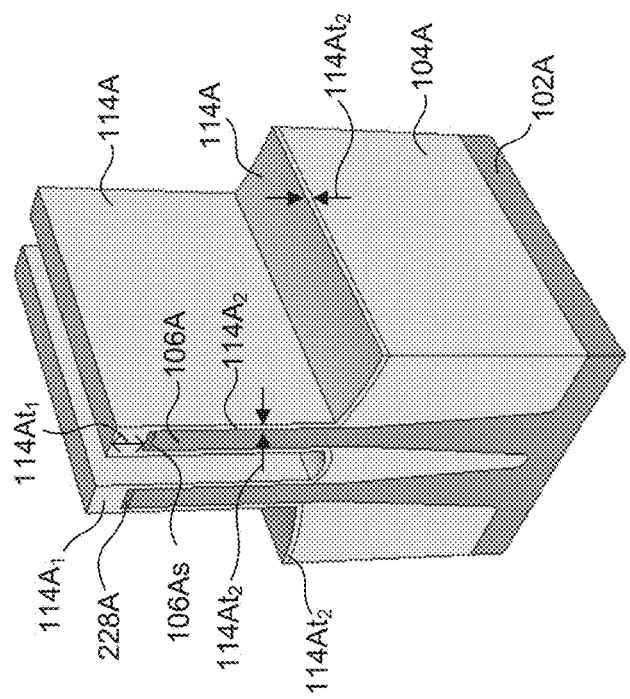

Further shown in FIGS. 7A and 7B, portions 228A and 228B of respective doped a-Si layers 640A and 640B can remain unoxidized during the high temperature anneal process and can form interlayers between top surfaces 106As and IO oxide layer 114A and between top surfaces 106Bs and protective oxide layer 114B, respectively. Portions 228A and 228B can each have a vertical thickness ranging from about 0.01 nm to about 5 nm.

Figure 8B:
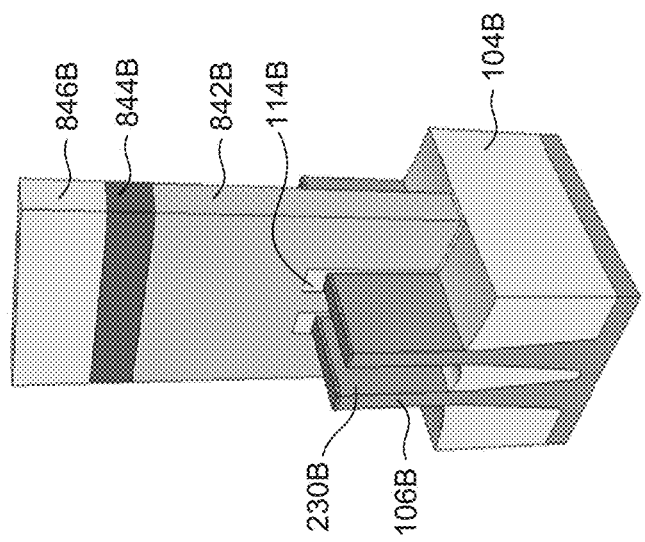
Figure 8A:
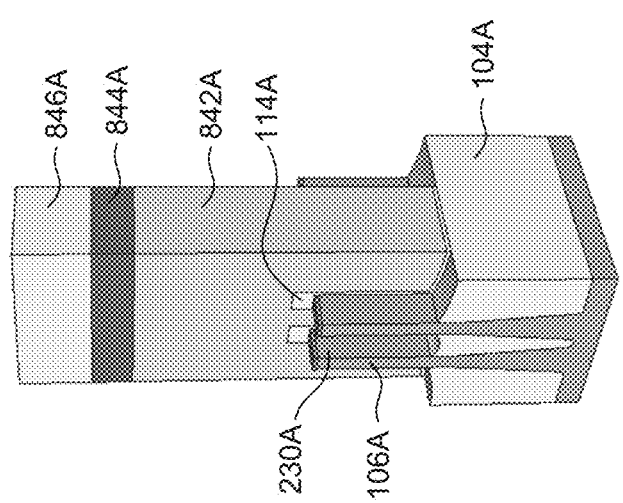

In referring to FIG. 3, in operation 325, polysilicon structures are formed on the IO oxide layer and the protective oxide layer of the first and second finFETs. For example, as shown in FIGS. 8A and 8B, polysilicon structures 842A and 842B can be formed on structures of FIGS. 7A and 7B. In some embodiments, vertical dimensions of polysilicon structures 842A and 842B can be in a range from about 90 nm to about 200 nm.

In some embodiments, polysilicon structures 842A and 842B can be formed substantially simultaneously by blanket deposition of polysilicon, followed by photolithography and etching of the deposited polysilicon. The deposition process can include chemical vapor deposition (CVD), physical vapor deposition (PVD), atomic layer deposition (ALD), other suitable deposition methods, or a combination thereof. Photolithography can include photoresist coating (e.g., spin-on coating), soft baking, mask aligning, exposure, post-exposure baking, developing the photoresist, rinsing, drying (e.g., hard baking), other suitable processes, or a combination thereof. Etching processes can include dry etching, wet etching, and/or other etching methods (e.g., reactive ion etching).

In some embodiments, etching of the deposited polysilicon to form polysilicon structures 842A and 842B can include four etching steps. In some embodiments, the first polysilicon etch step can include using a gas mixture having hydrogen bromide (HBr), oxygen ($O_2$), fluoroform ($CHF_3$), and chlorine ($Cl_2$). In some embodiments, the second polysilicon etch step can include using a gas mixture having HBr, $O_2$, $Cl_2$, and nitrogen ($N_2$) at a pressure of about 45 mtorr to about 60 mtorr. In some embodiments, the third polysilicon etch step can include using a gas mixture having HBr, $O_2$, $Cl_2$, $N_2$, and argon (Ar) at a pressure of about 45 mtorr to about 60 mtorr. In some embodiments, the fourth polysilicon etch step can include using a gas mixture having HBr, $O_2$, $Cl_2$, and $N_2$ at a pressure of about 45 mtorr to about 60 mtorr. In some embodiments, the first polysilicon etch step can have a higher polysilicon etch rate than the second, third, and/or fourth polysilicon etch steps. The first polysilicon etch step can be used to etch portions of the blanket deposited polysilicon above fin structures 106A and 106B that are not part of polysilicon structures 842A and 842B. The second, third, and fourth polysilicon etch steps can be used to etch portions of the blanket deposited polysilicon within high aspect ratio spaces 230A and 230B that are not part of polysilicon structures 842A and 842B.

During the etching of the deposited polysilicon, the thicker portions $114A_1$ and $114B_1$ of respective IO oxide layer 114A and protective oxide layer 114B on respective top surfaces 106As and 106Bs can help to protect respective fin structures 106A and 106B from being etched and/or damaged. The presence of these thicker portions $114A_1$ and $114B_1$ can allow longer etching time than used in other finFETs for removing the deposited polysilicon from high aspect ratio spaces 230A and 230B (e.g., aspect ratio greater than 1:15, 1:18, or 1:20) between respective fin structures 106A and 106B. The longer etching time can help to substantially reduce or eliminate polysilicon residue in spaces 230A and 230B, and consequently, improve performance and reliability of IO and non-IO finFETs 100A and 100B.

In some embodiments, polysilicon structures 842A and 842B and hard mask layers 844A, 844B, 846A, and 846B can be replaced in a gate replacement process during subsequent processing to form gate structures 110A and 110B discussed above. In some embodiments, hard mask layers 844A and 846A and hard mask layers 844B and 846B can be patterned on respective polysilicon structures 842A and 842B to protect polysilicon structures 842A and 842B from subsequent processing steps. Hard mask layers 844A, 846A, 844B, and 846B can each include insulating material such as, for example, silicon nitride.

Figure 9A:
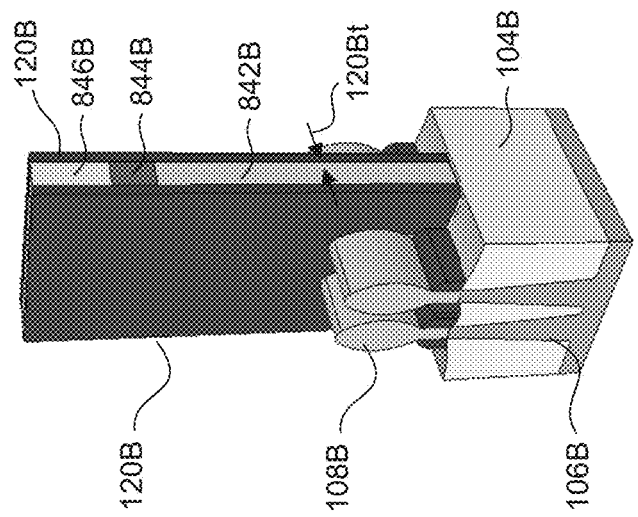
Figure 9B:
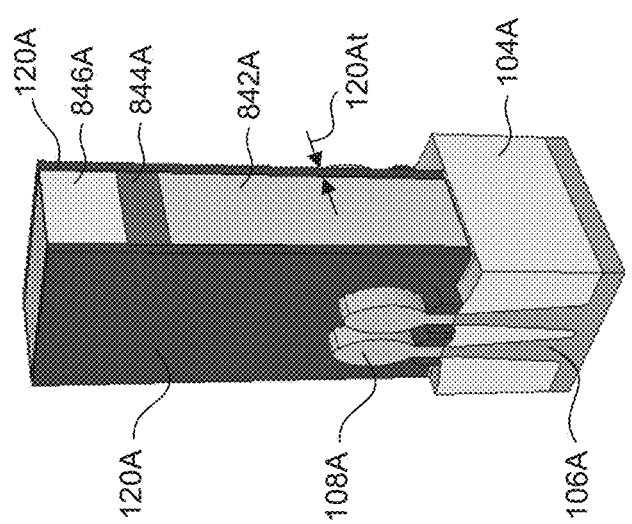

In referring to FIG. 3, in operation 330, spacers are formed on sidewalls of the polysilicon structures and epitaxial S/D regions are formed. For example, as shown in FIGS. 9A and 9B, spacers 120A and 120B can be formed substantially simultaneously on sidewalls of respective polysilicon structures 842A and 842B and epitaxial S/D regions 108A and 108B can be formed substantially simultaneously on recessed portions of respective fin structures 106A and 106B.

The formation of spacers 120A and 120B can include blanket deposition of an insulating material (e.g., an oxide or a nitride material) on the structures of FIGS. 8A and 8B by a CVD, a PVD, or an ALD process followed by photolithography and an etching process (e.g., reactive ion etching or other dry etching process using a chlorine or fluorine based etchant). Spacer 120A and 120B can each have a thickness 120At and 120Bt in a range from about 5 nm to about 15 nm, respectively, according to some embodiments.

The formation of spacers 120A and 120B can be followed by etch back of the portions of fin structures 106A and 106B that are not covered by respective polysilicon structures 842A and 842B and spacers 120A and 120B. In some embodiments, a biased etching process can be performed to etch back these portions of fin structures 106A and 106B. The etching process can be performed under a pressure of about 1 mTorr to about 1000 mTorr, a power of about 50 W to about 1000 W, a bias voltage of about 20 V to about 500 V, at a temperature of about 40° C. to about 60° C., and using HBr and/or $Cl_2$ as etch gases. During the etching process, polysilicon structures 842A and 842B can be protected from being etched by respective hard mask layers 844A and 846A and hard mask layers 844B and 846B.

The etch back process can be followed by the epitaxial growth of S/D regions 108A and 108B on the recessed portions of respective fin structures 106A and 106B. In some embodiments, of S/D regions 108A and 108B can be grown by (i) chemical vapor deposition (CVD) such as, for example, by low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, of S/D regions 108A and 108B can be grown by an epitaxial deposition/partial etch process, which repeats the epitaxial deposition/partial etch process at least once. In some embodiments, of S/D regions 108A and 108B can be grown by selective epitaxial growth (SEG), where an etching gas is added to promote the selective growth of semiconductor material on the recessed portions of respective fin structures 106A and 106B, but not on insulating material (e.g., dielectric material of STI regions 104A and 104B).

In some embodiments, both of S/D regions 108A and 108B can be p-type or n-type. In some embodiments, of S/D regions 108A and 108B can be of opposite doping type with respect to each other. In some embodiments, p-type of S/D regions 108A and 108B can include SiGe and can be in-situ doped during an epitaxial growth process using p-type dopants such as, for example, boron, indium, or gallium. For p-type in-situ doping, p-type doping precursors such as, but not limited to, diborane (B2H6), boron trifluoride (BF3), and/or other p-type doping precursors can be used. In some embodiments, n-type of S/D regions 108A and 108B can include Si and can be in-situ doped during an epitaxial growth process using n-type dopants such as, for example, phosphorus or arsenic. For n-type in-situ doping, n-type doping precursors such as, but not limited to, phosphine ($PH_3$), arsine ($AsH_3$), and/or other n-type doping precursor can be used.

In some embodiments, instead of the etch back of the portions of fin structures 106A and 106B and the subsequent growth of S/D regions 108A and 108B on the recessed portions of fin structures 106A and 106B, S/D regions 108A and 108B can be epitaxially grown on respective fin structures 106A and 106B that extend above STI regions 104A and 104B and are not covered by respective polysilicon structures 842A and 842B and spacers 120A and 120B.

In referring to FIG. 3, in operation 335, the polysilicon structures are removed. For example, polysilicon structures 842A and 842B along with hard mask layers 844A, 846A, 844B, and 846B can be removed from 10 and non-IO finFETs 100A and 100B to form the structures of FIGS. 10A and 10B. The removal of polysilicon structures 842A and 842B and hard mask layers 844A, 846A, 844B, and 846B can be performed using a dry etching process (e.g., reaction ion etching) or a wet etching process. In some embodiments, the gas etchants used in the dry etching process can include chlorine, fluorine, bromine, or a combination thereof. In some embodiments, an $NH_4OH$ wet etch can be used to remove polysilicon structures 842A and 842B, or a dry etch followed by a wet etch process can be used to remove polysilicon structures 842A and 842B.

Figure 10A:
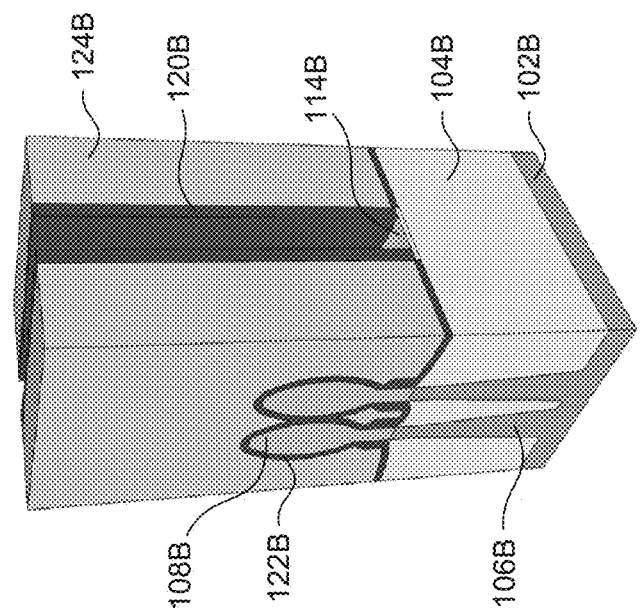
Figure 10B:
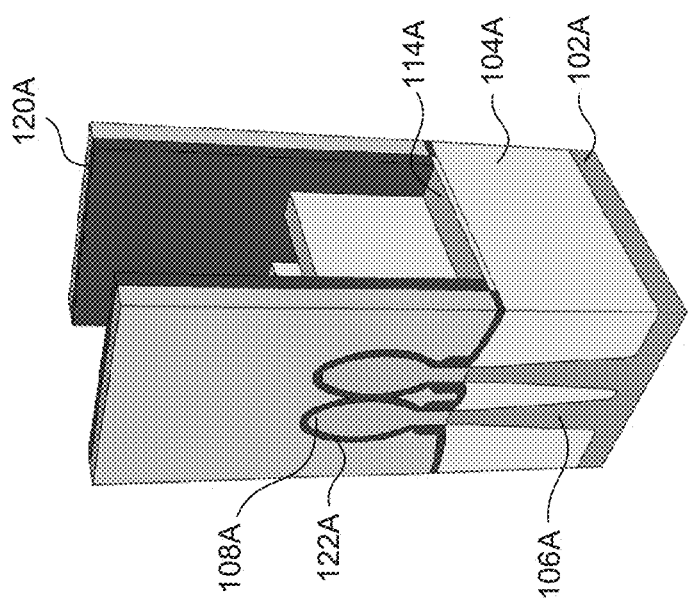
Figure 11B:
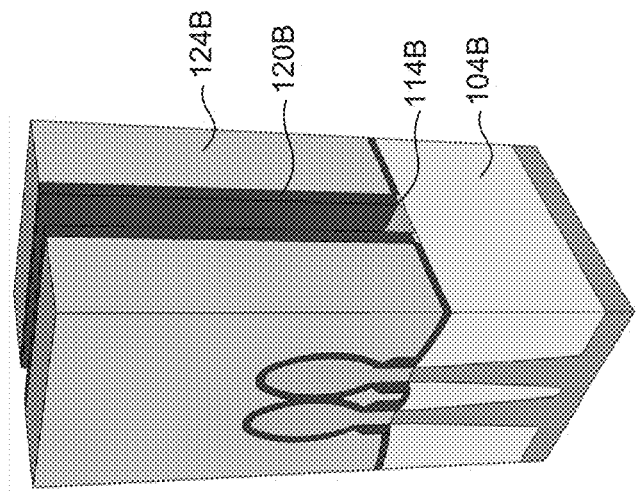
Figure 11A:
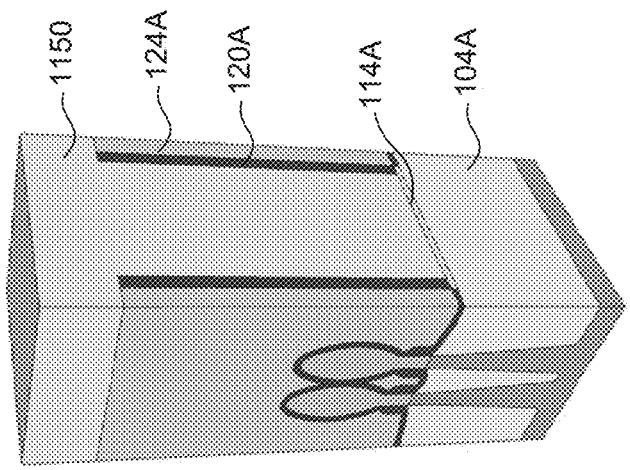

In some embodiments, prior to the removal of polysilicon structures 842A and 842B, ESLs 122A and 122B, and ILD layers 124A and 124B can be formed as shown in FIGS. 10A and 10B. In some embodiments, ESLs 122A and 122B can each include, for example, SiNx, SiON, SiC, SiCN, BN, SiBN, SiCBN, or a combination thereof. In some embodiments, ESLs 122A and 122B can each include silicon nitride formed by low pressure chemical vapor deposition (LP-CVD), plasma enhanced chemical vapor deposition (PECVD), chemical vapor deposition (CVD), or atomic layer deposition (ALD). In some embodiments, ILD layers 124A and 124B can each include a dielectric material. The dielectric material of ILD layers 124A and 124B can be deposited using a deposition method suitable for flowable dielectric materials (e.g., flowable silicon oxide). For example, flowable silicon oxide can be deposited for ILD layers 124A and 124B using flowable CVD (FCVD).

In referring to FIG. 3, in operation 340, a layer of photoresist (PR) is deposited to mask exposed portions of the IO oxide layer of the first finFET and to selectively remove exposed portions of the protective oxide layer of the second finFET is removed. For example, a layer of PR 1150 can be deposited on the structure of FIG. 10A to form the structure of FIG. 11A. The deposition of layer of PR 1150 can be followed by an etching process to selectively remove exposed portions of protective oxide layer 114B that were under polysilicon structure 842B. The layer of PR 1150 helps to protect IO oxide layer 114A from being etched during the selective etching of the exposed portions of protective oxide layer 114B. The removal of the exposed portions of protective oxide layer 114B can be performed using a dry etching process (e.g., reaction ion etching), a wet etching process (e.g., using diluted HF), or a combination thereof. In some embodiments, the gas etchants used in the dry etching process can include chlorine, fluorine, bromine, or a combination thereof. The removal of the exposed portions of protective oxide layer 114B can be followed by removal of layer of PR 1150.

In referring to FIG. 3, in operation 345, gate structures are formed over the fin structures. For example, gate structures 110A and 110B are formed in the respective structures of FIGS. 11A and 11B after the removal of layer of PR 1150 to form the respective structures of FIGS. 1A and 1B. The formation of each of gate structures 110A and 110B can include substantially simultaneous deposition of respective dielectric layers 116A and 116B. Dielectric layers 116A and 116B can each include silicon oxide and can be formed by CVD, atomic layer deposition (ALD), physical vapor deposition (PVD), e-beam evaporation, or other suitable process. In some embodiments, dielectric layers 116A and 116B can each include (i) a layer of silicon oxide, silicon nitride, and/or silicon oxynitride, (ii) a high-k dielectric material such as, for example, hafnium oxide ($HfO_2$), $TiO_2$, HfZrO, $Ta_2O_3$, $HfSiO_4$, $ZrO_2$, $ZrSiO_2$, (iii) a high-k dielectric material having oxides of Li, Be, Mg, Ca, Sr, Sc, Y, Zr, Al, La, Ce, Pr, Nd, Sm, Eu, Gd, Tb, Dy, Ho, Er, Tm, Yb, or Lu, or (iv) a combination thereof. High-k dielectric layers can be formed by ALD and/or other suitable methods. In some embodiments, dielectric layers 116A and 116B can each include a single layer or a stack of insulating material layers.

The deposition of dielectric layers 116A and 116B can be followed by substantially simultaneous deposition of gate electrodes 118A and 118B. Gate electrodes 118A and 118B can each include a single metal layer or a stack of metal layers. The stack of metal layers can include metals different from each other. In some embodiments, gate electrode 124 can include a suitable conductive material such as, for example, Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof. Gate electrode 124 can be formed by ALD, PVD, CVD, or other suitable deposition process.

The deposited dielectric layers 116A and 116B and gate electrodes 118A and 118B can be planarized by a CMP process. The CMP process can substantially coplanarize top surfaces of dielectric layers 116A and 116B and gate electrodes 118A and 118B with top surfaces of ILD layers 124A and 124B as shown in FIGS. 1A and 1B.

FIGS. 12A and 12B are cross-sectional views along lines A-A and B-B of IO and non-IO finFETs 100A and 100B of FIGS. 1A and 1B, respectively, according to some embodiments. The description of elements in FIGS. 1A-2A and 1B-2B applies to elements in FIGS. 12A and 12B with the same annotations unless mentioned otherwise. It will be recognized that the views of IO and non-IO finFETs 100A and 100B in FIGS. 12A and 12B are shown for illustration purposes and may not be drawn to scale. Based on the disclosure herein, it will be recognized that cross-sectional shapes of STI regions 104A and 104B, fin structures 106A and 106B, and gate structures 110A and 110B shown in FIGS. 12A and 12B are illustrative and are not intended to be limiting.

As shown in FIG. 12A, IO oxide layer 114A, dielectric layer 116A, and gate electrode 118A of IO finFET 100A can wrap around portions of fin structures 106A extending above STI region 104A. In some embodiments, IO oxide layer 114A can have a first portion $114A_3$ having a first thickness $114At_3$ on top surfaces 106As of portions of fin structures 106A extending above STI region 104A and can have a second portion $114A_4$ having a second thickness $114At_4$ on top surface 104As of STI region 104A and on sidewalls of portions of fin structures 106A extending above STI region 104A. In some embodiments, thickness $114At_3$ can be greater than thickness $114At_4$ by a value ranging from about 0.5 nm to about 3 nm. Thickness $114At_1$ can range from about 2 nm to about 5 nm and thickness $114At_2$ can range from about 1 nm to about 3 nm, according to some embodiments. In some embodiments, as shown in FIG. 12A, each of portions $114A_3$ can have a width $114Aw_1$ that is greater than width $114Aw_2$, which is a sum of the widths of one of fin structures 106A and its sidewalls. In some embodiments, as shown in FIG. 12A, each of portions $114A_3$ extends laterally beyond sidewalls of portions $114A_4$ by a value of about 0.1 nm to about 1 nm.

The thicker portions $114A_3$ of IO oxide layer 114A on top surfaces 106As can help to protect fin structures 106A during patterning and etching of polysilicon structure (element 842A shown in FIG. 17A) that can be subsequently replaced by gate structure 110A in a gate replacement process. The presence of these protective thicker portions $114A_3$ can allow longer etching time than used in other finFETs for removing polysilicon from high aspect ratio spaces 230A (e.g., aspect ratio greater than 1:15, 1:18, or 1:20) between fin structures 106A without substantially etching and/or damaging fin structures 106A during the formation of the polysilicon structures (element 842A shown in FIG. 17A). The longer etching time can help to substantially reduce or eliminate polysilicon residue in spaces 230A, and consequently, improve performance and reliability of IO finFET 100A.

In some embodiments, the thicker portions $114A_3$ of IO oxide layer 114A can be grown on top surfaces 106As of fin structures 106A. Such thicker growth of thicker portions $114A_3$ on top surfaces 106As can be performed by forming an oxide layer (shown in FIG. 16A) on top surfaces 106As followed by an oxygen plasma treatment of the deposited oxide layer. The process of growing thicker portions $114A_3$ of IO oxide layer 114A on top surfaces 106As is described in further details with reference to FIG. 16A.

Referring to FIG. 12B, similar to IO finFET 100A, dielectric layer 116B and gate electrode 118B of non-IO finFET 100B can wrap around portions of fin structures 106B extending above STI region 104B. Also, shown in FIG. 12B, in contrast to IO finFET 100A, non-IO finFET 100B may not have an IO oxide layer similar to IO oxide layer 114A on top surface 104Bs of STI region 104B and between dielectric layer 116B and portions of fin structures 106B extending above STI region 104B. However, as discussed below with reference to FIG. 16, a protective oxide layer (not shown in FIG. 12B; element 114B shown in FIGS. 1B and 16B) similar to IO oxide layer 114A (discussed above with reference to FIG. 12A) can be used to protect fin structures 106B during the formation of polysilicon structures (element 842B shown in FIG. 17B) of non-IO finFET 100B. The protective oxide layer 114B can be removed prior to the formation of gate structure 110B. Similar to IO oxide layer 114A, the protective oxide layer can allow longer etching time for removing polysilicon from high aspect ratio spaces 230B (e.g., aspect ratio greater than 1:15, 1:18, or 1:20) between fin structures 106B without substantially etching and/or damaging fin structures 106B during the formation of the polysilicon structures (element 842B shown in FIG. 8B). The longer etching time can help to substantially reduce or eliminate polysilicon residue in spaces 230B, and consequently, improve performance and reliability of non-IO finFET 100B.

Figure 13:
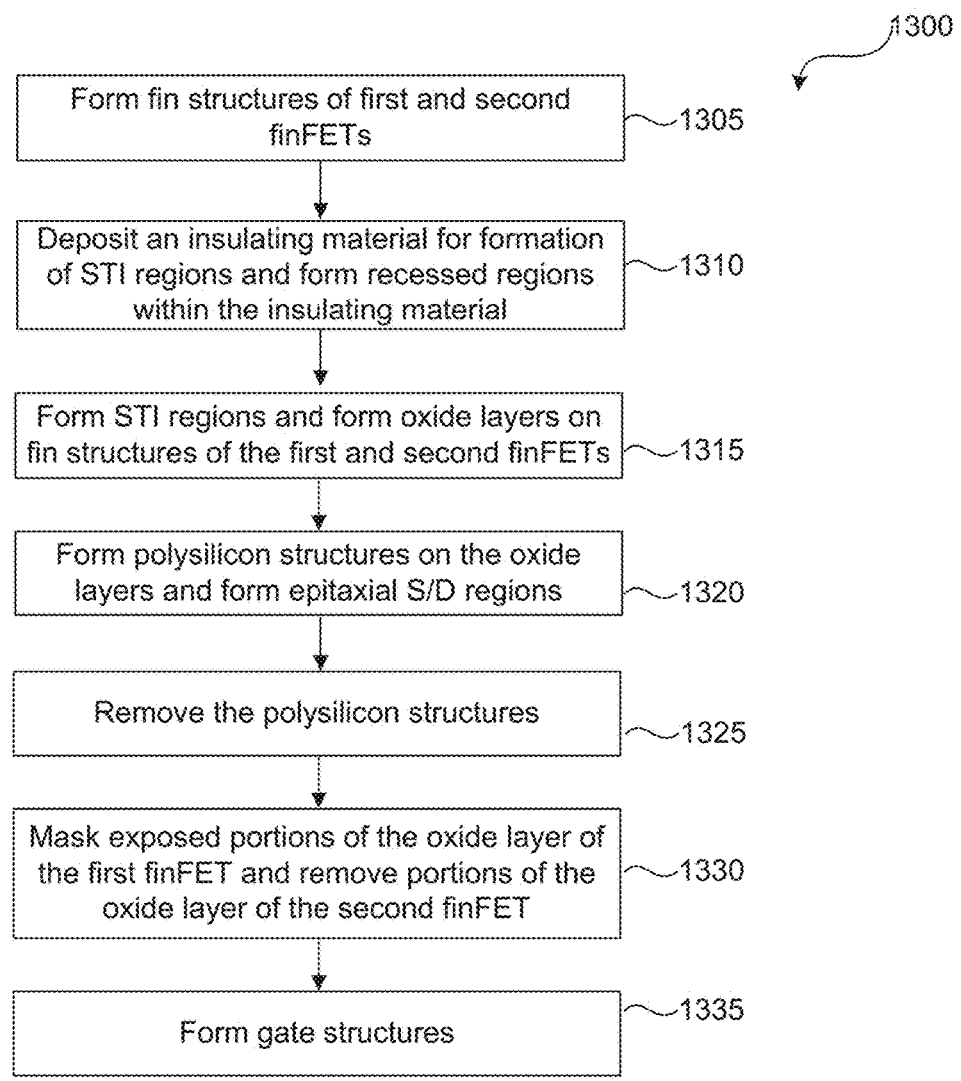
FIG. 13 is a flow diagram of a method for fabricating finFETs, in accordance with some embodiments.

FIG. 13 is a flow diagram of an example method 1300 for fabricating IO and non-IO finFETs 100A and 100B as described above with reference to FIGS. 1A, 1B, 12A, and 12B, according to some embodiments. For illustrative purposes, the operations illustrated in FIG. 13 will be described with reference to the example fabrication process for fabricating devices 100A and 100B as illustrated in FIGS. 14A-19A and FIGS. 14B-19B, respectively. FIGS. 14A-19A and 14A-19B are isometric views of respective IO and non-IO finFETs 100A and 100B at various stages of its fabrication, according to some embodiments. Operations can be performed in a different order or not performed depending on specific applications. It should be noted that method 1300 does not produce complete IO and non-IO finFETs 100A and 100B. Accordingly, it is understood that additional processes can be provided before, during, and after method 1300, and that some other processes can only be briefly described herein. Elements in FIGS. 14A-19A and 14B-19B with the same annotations as elements in FIGS. 1A-1B and 12A-12B are described above.

Figure 14B:
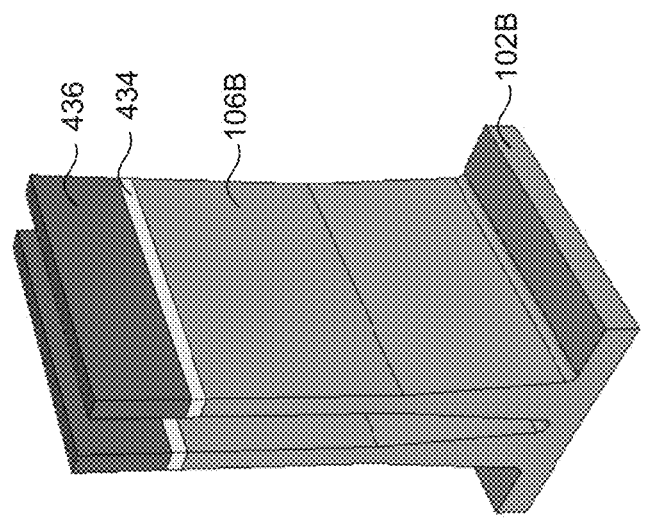
Figure 14A:
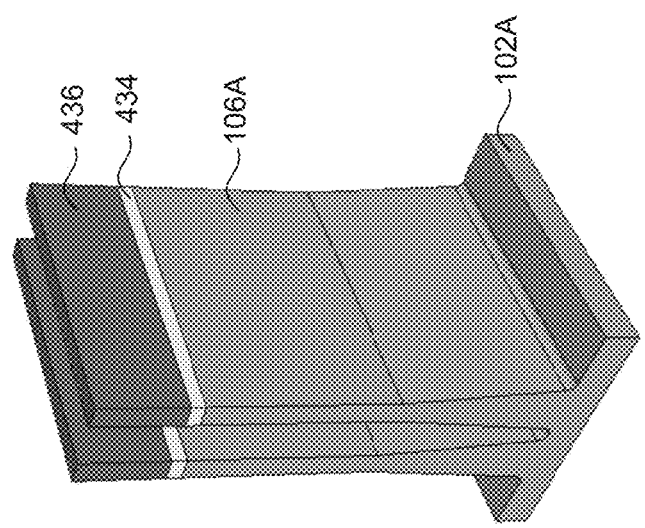

In operation 1305, fin structures of first and second finFETs are formed on a substrate. For example, as shown in FIGS. 14A and 14B, fin structures 106A of IO finFET 100A and fin structures 106B of non-IO finFET 100B are formed substantially simultaneously on respective substrates 102A and 102B as described with reference to FIGS. 4A and 4B.

In referring to FIG. 13, in operation 1310, a layer of insulating material for STI regions is deposited and the patterned hard mask layers are removed to form recessed regions within the layer of insulating material. For example, a layer of insulating material 104* can be blanket deposited on the structures of FIGS. 14A and 14B followed by a chemical mechanical polishing (CMP) process, and an etching process to form the structures of FIGS. 15A and 5B substantially simultaneously as described with reference to FIGS. 5A and 5B.

Figure 16A:
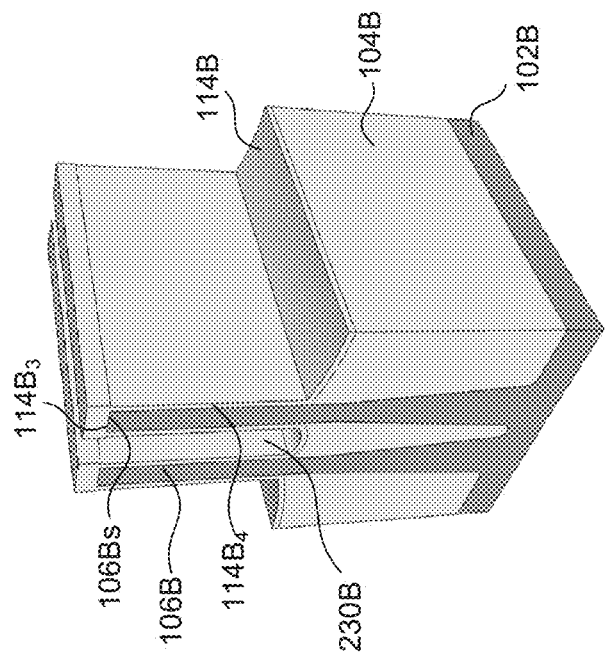
Figure 16B:
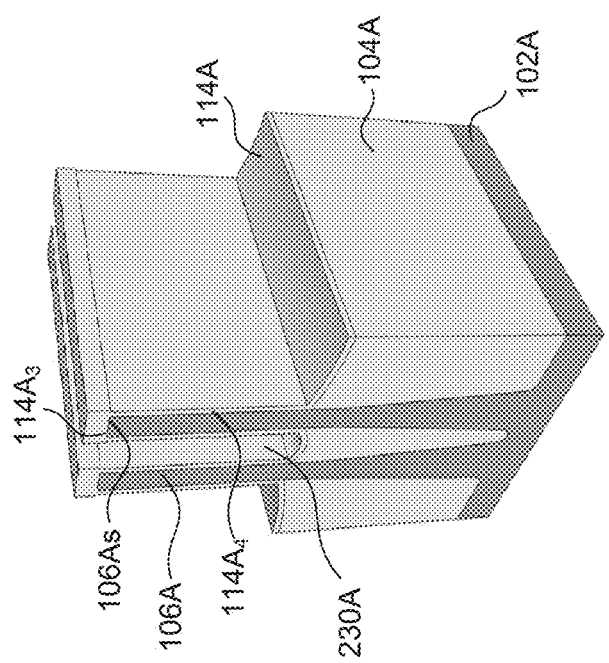

In referring to FIG. 13, in operation 1315, STI regions are formed and an IO oxide layer and a protective oxide layer are formed on respective fin structures of the first and second finFETs. For example, as shown in FIGS. 16A and 16B, STI regions 104A and 104B and IO oxide layer 114A and protective oxide layer 114B can be formed. The formation of STI regions 104A and 104B can include an etching process to etch back layer of insulating material 104* (FIGS. 15A and 15B) as described with reference to FIGS. 6A and 6B. The formation of STI regions 104A and 104B can be followed by a deposition of a layer of an oxide material and an oxygen plasma treatment to form IO oxide layer 114A and protective oxide layer 114B substantially simultaneously.

The layer of oxide material can include, for example, silicon oxide and can be formed by CVD, atomic layer deposition (ALD), plasma enhanced ALD (PEALD), physical vapor deposition (PVD), e-beam evaporation, or other suitable process. In some embodiments, the layer of oxide material can be deposited using PEALD at an energy ranging from about 400 W to about 500 W and at a temperature ranging from about 300° C. to about 500° C. Thickness of the deposited oxide material can be between about 2.5 nm to about 4 nm (e.g., 3 nm).

The deposition process can be followed by an oxygen plasma treatment of the deposited layer of oxide material at an energy ranging from about 400 W to about 600 W. The oxygen plasma treatment can be an anisotropic treatment that helps to thicken portions of the deposited layer of oxide material by converting top portions of fin structures 106A and 106B into silicon oxide material. Due to greater concentrations of oxygen precursors surrounding top surfaces of fin structures 106A and 106B, the oxygen plasma treatment can convert top portions of fin structures 106A and 106B into silicon oxide but may not substantially thicken portions of the deposited layer of oxide material that are on sidewalls of fin structures 106A and 106B. The oxygen plasma treatment can convert the top surfaces of fin structures into silicon oxide and may also convert a portion of the sidewall surfaces that are at the top of fin structures into silicon oxide, resulting in the platform shaped thicker portions $114A_3$ and $114B_3$ described above with reference to FIG. 12A. The oxygen plasma treatment process can be performed at about room temperature for a suitable period of time such as, for example, in a range of about 3 s to about 30 s (e.g., 3 s to 30 s). The oxygen precursor concentration of the oxygen gas flow rate can be between 10% to about 30% (e.g., 10% to 30%). In some embodiments, factors—such as a higher plasma energy, a longer treatment time, and a higher oxygen gas flow rate—can lead to a greater thickness of the formed silicon oxide material. In some embodiments, the treatment process can be a timed process where a nominal thickness of the converted silicon oxide material can be achieved by controlling the treatment time.

Figure 17B:
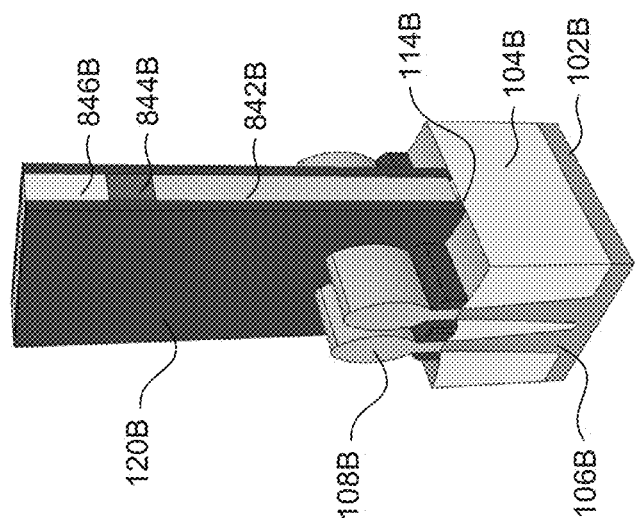
Figure 17A:
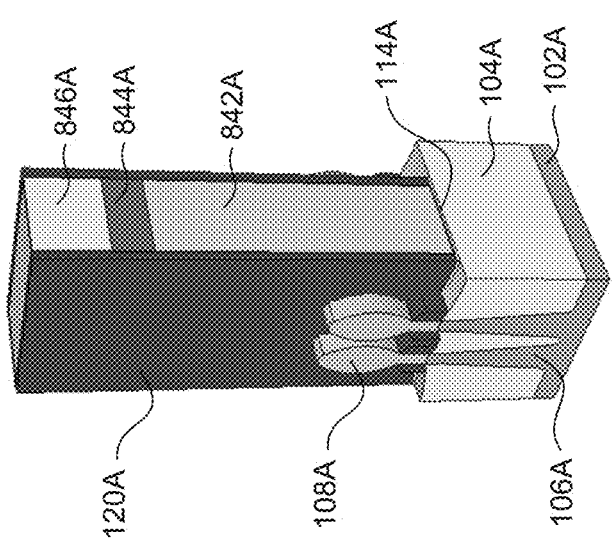
Figure 19B:
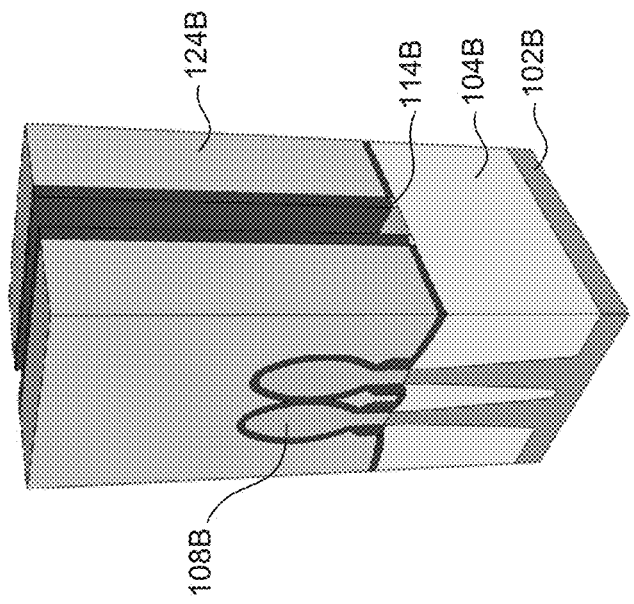
Figure 19A:
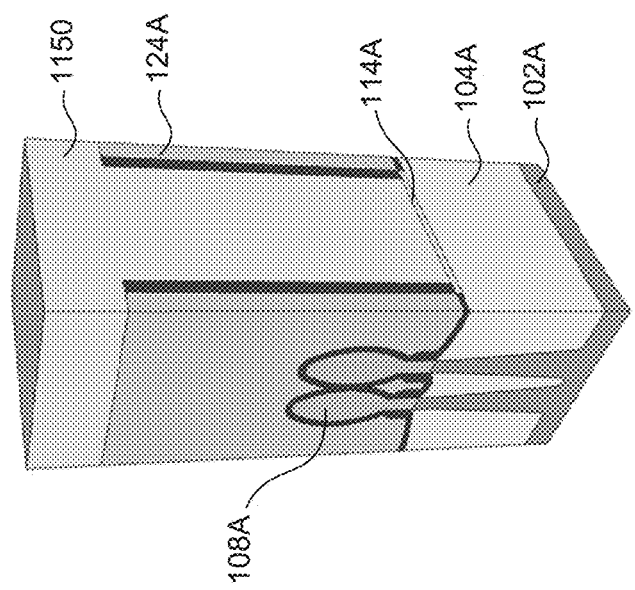

In referring to FIG. 13, in operation 1320, polysilicon structures are formed on the IO oxide layer and the protective oxide layer of the first and second finFETs and epitaxial S/D regions are formed. For example, as shown in FIGS. 17A and 17B, polysilicon structures 842A and 842B can be formed on respective structures of FIGS. 16A and 16B, spacers 120A and 120B can be formed substantially simultaneously on sidewalls of respective polysilicon structures 842A and 842B, and epitaxial S/D regions 108A and 108B can be formed substantially simultaneously on recessed portions of respective fin structures 106A and 106B as described with reference to FIGS. 8A-9A and 8B-9B.

During the formation of polysilicon structures 842A and 842B, the thicker portions $114A_3$ and $114B_3$ (shown in FIGS. 12A-12B and 16A-16B) of respective IO oxide layer 114A and protective oxide layer 114B on respective top surfaces 106As and 106Bs can help to protect respective fin structures 106A and 106B from being etched and/or damaged. The presence of these thicker portions $114A_3$ and $114B_3$ can allow longer etching time than used in other finFETs for removing the deposited polysilicon from high aspect ratio spaces 230A and 230B (e.g., aspect ratio greater than 1:15, 1:18, or 1:20) between respective fin structures 106A and 106B. The longer etching time can help to substantially reduce or eliminate polysilicon residue in spaces 230A and 230B (shown in FIGS. 16A and 16B), and consequently, improve performance and reliability of IO and non-IO finFETs 100A and 100B.

In referring to FIG. 13, in operation 1325, the polysilicon structures are removed. For example, polysilicon structures 842A and 842B along with hard mask layers 844A, 846A, 844B, and 846B can be removed to form the structures of FIGS. 18A and 18B. The removal of polysilicon structures 842A and 842B and hard mask layers 844A, 846A, 844B, and 846B can be performed as described with reference to FIGS. 10A and 10B. In some embodiments, prior to the removal of polysilicon structures 842A and 842B, ESLs 122A and 122B and ILD layers 124A and 124B can be formed as described with reference to FIGS. 10A and 10B.

In referring to FIG. 13, in operation 1330, a layer of photoresist (PR) is deposited to mask exposed portions of the IO oxide layer of the first finFET and to selectively remove exposed portions of the protective oxide layer of the second finFET is removed. For example, a layer of PR 1150 can be deposited on the structure of FIG. 18A to form the structure of FIG. 19A. The deposition of layer of PR 1150 can be followed by an etching process to selectively remove exposed portions of protective oxide layer 114B that were under polysilicon structure 842B in FIG. 17A. The layer of PR 1150 helps to protect IO oxide layer 114A from being etched during the selective etching of the exposed portions of protective oxide layer 114B. The removal of the exposed portions of protective oxide layer 114B can be performed using a dry etching process (e.g., reaction ion etching), a wet etching process (e.g., using diluted HF), or a combination thereof. In some embodiments, the gas etchants used in the dry etching process can include chlorine, fluorine, bromine, or a combination thereof. The removal of the exposed portions of protective oxide layer 114B can be followed by removal of layer of PR 1150.

In referring to FIG. 13, in operation 335, gate structures are formed over the fin structures. For example, gate structures 110A and 110B are formed in the respective structures of FIGS. 19A and 19B after the removal of layer of PR 1150 to form the respective structures of FIGS. 1A and 1B as described with in operation 345 above.

The above embodiments describe structures and methods for improving etch profiles of polysilicon structures (e.g., polysilicon structures 842A and/or 842B) of IO devices (e.g., IO finFET 100A) and/or non-IO devices (e.g., non-IO finFET 100B) of integrated circuits. The polysilicon structures can be fabricated within high aspect ratio spaces (e.g., aspect ratio greater than 1:15, 1:18, or 1:20) between adjacent fin structures (e.g., fin structures 106A and/or 106B) of the IO and/or non-IO devices. The example methods can form protective regions (e.g., oxide layers 114A and/or 114B) on the fin structures to obtain the improved etch profiles of the polysilicon structures without substantial damage to the fin structures. Improving the etch profiles of the polysilicon structures can help to improve subsequent formation of gate structures (e.g., gate structures 110A and/or 110B) of the IO and/or non-IO devices, and consequently, help to improve performance and reliability of the IO and/or non-IO devices.

The example methods can also help to substantially reduce or eliminate polysilicon residues in the high aspect ratio spaces between the adjacent fin structures of the IO and/or non-IO devices during the formation of the polysilicon structures. The substantial reduction or elimination of the polysilicon residue can help to substantially reduce or eliminate current leakage between subsequently formed source/drain (S/D) regions and gate structures of the IO and non-IO devices, and consequently, help to improve performance and reliability of the IO and/or non-IO devices.

In some embodiments, a method of forming first and second fin field effect transistors (finFETs) on a substrate includes forming first and second fin structures of the first and second finFETs, respectively, on the substrate and forming first and second oxide regions having first and second thicknesses on top surfaces of the first and second fin structures, respectively. The method further includes forming third and fourth oxide regions having third and fourth thicknesses on sidewalls on the first and second fin structures, respectively. The first and second thicknesses are greater than the third and fourth thicknesses, respectively. The method further includes forming a first polysilicon structure on the first and third oxide regions and forming a second polysilicon structure on the second and fourth oxide regions. The method also includes forming first and second source/drain regions on first and second recessed portions of the first and second fin structures, respectively and replacing the first and second polysilicon structures with first and second gate structures, respectively.

In some embodiments, a method of forming first and second fin field effect transistors (finFETs) on a substrate includes forming first and second fin structures of the first and second finFETs, respectively, on the substrate. The method further includes forming a first oxide layer on the first fin structure, and forming a second oxide layer on the second fin structure. A first thickness of a first portion of the first oxide layer on a top surface of the first fin structure is greater than a second thickness of a second portion of the first oxide layer on a sidewall of the first fin structure. A first thickness of a first portion of the second oxide layer on a top surface of the second fin structure being is than a second thickness of a second portion of the second oxide layer on a sidewall of the second fin structure. The method further includes forming first and second polysilicon structures on the first and second oxide layers, respectively and forming first and second source/drain regions on first and second recessed portions of the first and second fin structures, respectively.

In some embodiments, a semiconductor device includes first and second fin field effect transistors (finFETs) on a substrate. The first finFET includes a first fin structure on the substrate, a first epitaxial source/drain region on the first fin structure, and a first gate structure having a first oxide layer on the first fin structure. A first thickness of a first portion of the first oxide layer on a top surface of the first fin structure is greater than a second thickness of a second portion of the first oxide layer on a sidewall of the first fin structure. The second finFET includes a second fin structure on the substrate, a second epitaxial source/drain region on the second fin structure, and a second gate structure having a second oxide layer on the second fin structure. A first thickness of a first portion of the second oxide layer on a top surface of the second fin structure is substantially equal to a second thickness of a second portion of the second oxide layer on a sidewall of the second fin structure.

In some embodiments, a method of forming a fin field effect transistors (finFET) on a substrate includes forming a fin structure on the substrate, forming a first oxide region having a first thickness on a top surface of the fin structure, and forming a second oxide region having a second thickness on a sidewall on the fin structure. The first thickness is greater than the second thickness. The method further includes forming a polysilicon structure on the first and second oxide regions, forming epitaxial source/drain regions on a recessed portion of the fin structure, and replacing the polysilicon structure with a gate structures.

In some embodiments, a method of forming a fin field effect transistor (finFET) on a substrate includes forming a fin structure on the substrate, forming an oxide layer on the fin structure. A first thickness of a first portion of the oxide layer on a top surface of the fin structure is greater than a second thickness of a second portion of the oxide layer on a sidewall of the fin structure. The method further includes forming a polysilicon structure on the oxide layer and forming a source/drain region on recessed portions of the fin structure.

In some embodiments, a fin field effect transistor (finFET) includes a fin structure on a substrate, an epitaxial source/drain region on the fin structure, and a gate structure. The gate structure includes an oxide layer on the fin structure, a dielectric layer on the oxide layer, and a gate electrode on the dielectric layer. A first thickness of a first portion of the oxide layer on a top surface of the fin structure is greater than a second thickness of a second portion of the oxide layer on a sidewall of the fin structure.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming first and second fin field effect transistors (finFETs) on a substrate, the method comprising:
    forming first and second fin structures of the first and second finFETs, respectively, on the substrate;
    forming first and second oxide regions having first and second thicknesses on top surfaces of the first and second fin structures, respectively;
    forming third and fourth oxide regions having third and fourth thicknesses on sidewalls on the first and second fin structures, respectively, the first and second thicknesses being greater than the third and fourth thicknesses, respectively;
    forming a first polysilicon structure on the first and third oxide regions;
    forming a second polysilicon structure on the second and fourth oxide regions;

forming first and second source/drain regions on first and second recessed portions of the first and second fin structures, respectively; and replacing the first and second polysilicon structures with first and second gate structures, respectively.

2. The method of claim 1, wherein the forming the first and second oxide regions comprises:

forming first and second amorphous regions on the first and second fin structures, respectively, the first and second amorphous regions each having an amorphous material;

doping the first and second amorphous regions;

depositing first and second oxide layers on the first and second amorphous regions, respectively, and on sidewalls of the first and second fin structures, respectively; and annealing the first and second amorphous regions and the first and second oxide layers.

3. The method of claim 1, wherein the forming the first and second oxide regions comprises:

forming first and second amorphous silicon regions on the first and second fin structures, respectively;

doping the first and second amorphous silicon regions using a fluorine or oxygen dopant;

depositing first and second oxide layers on the first and second silicon amorphous regions, respectively; and annealing the first and second amorphous silicon regions and the first and second oxide layers.

4. The method of claim 1, wherein the first or second thickness is greater than the third or fourth thickness by a value ranging from about 0.5 nm to about 3 nm.

5. The method of claim 1, wherein the replacing the first and second polysilicon structures with the first and second gate structures, respectively, comprises:

removing the first and second polysilicon structures;

depositing a photoresist layer on portions of the first and third oxide regions exposed by the removing the first polysilicon structure;

etching portions of the second and fourth oxide regions exposed by the removing the second polysilicon structure;

forming the first gate structure on the portions of the first and third oxide regions; and forming the second gate structure on the portions of the second and fourth oxide regions.

6. The method of claim 1, wherein the forming the first polysilicon structure on the first and third oxide regions comprises:

depositing a polysilicon layer on the first and second oxide regions; and etching first and second portions of the polysilicon layer at first and second etch rates, respectively, the first etch rate being greater than the second etch rate.

7. The method of claim 2, wherein the forming the first and second amorphous regions comprises:

depositing a layer of insulating material on the first and second fin structures;

forming first and second recessed regions within the layer of insulating material and on the first and second fin structures, respectively;

depositing a layer of the amorphous material on the layer of insulating material to fill the first and second recessed regions; and removing portions of the layer of the amorphous material on the layer of insulating material to substantially coplanarize a top surface of the layer of insulating material with top surfaces of other portions of the layer of the amorphous material within the first and second recessed regions.

8. The method of claim 2, wherein a vertical dimension of the first or second amorphous region ranges from about 5 nm to about 20 nm.

9. A method of forming first and second fin field effect transistors (finFETs) on a substrate, the method comprising:

forming first and second fin structures of the first and second finFETs, respectively, on the substrate;

forming a first oxide layer on the first fin structure, a first thickness of a first portion of the first oxide layer on a top surface of the first fin structure being greater than a second thickness of a second portion of the first oxide layer on a sidewall of the first fin structure;

forming a second oxide layer on the second fin structure, a first thickness of a first portion of the second oxide layer on a top surface of the second fin structure being greater than a second thickness of a second portion of the second oxide layer on a sidewall of the second fin structure;

forming first and second polysilicon structures on the first and second oxide layers, respectively; and forming first and second source/drain regions on first and second recessed portions of the first and second fin structures, respectively.

10. The method of claim 9, wherein the first thickness of the first portion of the first oxide layer is greater than the second thickness of the second portion of the first oxide layer by a value ranging from about 0.5 nm to about 3 nm.

11. The method of claim 9, wherein the first portion of the first oxide layer extends laterally beyond a sidewall of the second portion of the first oxide layer by a value ranging from about 0.1 nm to about 1 nm.

12. The method of claim 9, wherein the forming the first and second oxide layers comprises:

depositing a layer of oxide material on the first and second fin structures; and treating the deposited layer of oxide material with an oxygen plasma.

13. The method of claim 9, wherein the forming the first and second oxide layers comprises:

depositing a layer of oxide material on the first and second fin structures; and treating the deposited layer of oxide material with an oxygen plasma at an energy ranging from about 400 W to about 600 W.

14. The method of claim 9, further comprising replacing the first and second polysilicon structures with first and second gate structures, respectively.

15. The method of claim 14, wherein the replacing the first and second polysilicon structures with the first and second gate structures, respectively, comprises:

removing the first and second polysilicon structures;

depositing a photoresist layer on portions of the first oxide layer exposed by the removing the first polysilicon structure;

etching portions of the second oxide layer exposed by the removing the second polysilicon structure;

forming the first gate structure on the portions of the first oxide layer, and forming the second gate structure on the portions of the second oxide layer.

16. A semiconductor device comprising:

a first fin field effect transistor (finFET) on a substrate, the first finFET comprising:

a first fin structure on the substrate, a first epitaxial source/drain region on the first fin structure, and a first gate structure having a first oxide layer on the first fin structure, a first thickness of a first portion of the first oxide layer on a top surface of the first fin structure being greater than a second thickness of a second portion of the first oxide layer on a sidewall of the first fin structure; and a second finFET on the substrate, the second finFET comprising:

a second fin structure on the substrate, a second epitaxial source/drain region on the second fin structure, and a second gate structure having a second oxide layer on the second fin structure, a first thickness of a first portion of the second oxide layer on a top surface of the second fin structure being substantially equal to a second thickness of a second portion of the second oxide layer on a sidewall of the second fin structure.

17. The semiconductor device of claim 16, further comprising first and second layers of amorphous silicon on the top surfaces of the first and second fin structures.

18. The semiconductor device of claim 16, wherein the first thickness of the first portion of the first oxide layer is greater than the second thickness of the second portion of the first oxide layer by a value ranging from about 0.5 nm to about 3 nm.

19. The semiconductor device of claim 16, wherein the first gate structure further comprises:

a dielectric layer on the first oxide layer, and a gate electrode on the dielectric layer.

20. The semiconductor device of claim 16, further comprising spacers on sidewalls the first gate structure, wherein the first oxide layer extends under the spacers.

* * * * *